US012638317B2

(12) United States Patent
Yamamoto et al.

(10) Patent No.: US 12,638,317 B2
(45) Date of Patent: May 26, 2026

(54) SUBSTRATE PROCESSING APPARATUS, ABNORMALITY DETECTION METHOD AND NON-TRANSITORY COMPUTER READABLE MEDIUM STORING ABNORMALITY DETECTION PROGRAM

(71) Applicant: SCREEN HOLDINGS CO., LTD., Kyoto (JP)

(72) Inventors: Tetsuya Yamamoto, Kyoto (JP); Yumiko Hirato, Kyoto (JP); Takehiro Sano, Kyoto (JP); Daiichi Kitagishi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 631 days.

(21) Appl. No.: 17/949,708

(22) Filed: Sep. 21, 2022

(65) Prior Publication Data
US 2023/0236048 A1 Jul. 27, 2023

(30) Foreign Application Priority Data

Sep. 22, 2021 (JP) ................................. 2021-154404
Mar. 24, 2022 (JP) ................................. 2022-048503

(51) Int. Cl.
*G01D 21/02* (2006.01)
*H01L 21/67* (2006.01)

(52) U.S. Cl.
CPC ........ *G01D 21/02* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 10,545,514 B2 * | 1/2020 | Yasuda | ................ G05D 7/0647 |
| 2006/0151112 A1 | 7/2006 | Yoshida et al. | .......... 156/345.15 |
| 2007/0179658 A1 | 8/2007 | Hamada | ......................... 700/121 |
| 2010/0211216 A1 | 8/2010 | Morita | .......................... 700/228 |

(Continued)

FOREIGN PATENT DOCUMENTS

| | | |
|---|---|---|
| CN | 104114987 A | 10/2014 |
| CN | 107406003 A | 11/2017 |

(Continued)

OTHER PUBLICATIONS

Office Action dated Aug. 28, 2024 for corresponding Korean Patent Application No. 10-2022-0115683.

(Continued)

*Primary Examiner* — Daniel S Larkin
(74) *Attorney, Agent, or Firm* — OSTROLENK FABER LLP

(57) ABSTRACT

In a substrate processing apparatus, a substrate is processed with use of a processing liquid. A first operation component and a second operation component are used in the substrate process. A first operation value of the first operation component and a second operation value of the second operation component are acquired by an operation value acquirer. Whether an abnormality has occurred is determined by an abnormality determiner based on the correlation between the first operation value and the second operation value that are acquired by the operation value acquirer.

5 Claims, 24 Drawing Sheets

(56) References Cited

U.S. PATENT DOCUMENTS

| | | | | |
|---|---|---|---|---|
| 2014/0376587 A1* | 12/2014 | Sakashita | ................. | B60K 6/48 |
| | | | | 374/1 |
| 2017/0236730 A1 | 8/2017 | Imamura et al. | | |
| 2018/0079311 A1 | 3/2018 | Ichikawa et al. | | |
| 2018/0138096 A1 | 5/2018 | Koyama et al. | | |
| 2018/0308730 A1* | 10/2018 | Nakamizo | ........... | G01M 3/2876 |
| 2019/0242788 A1 | 8/2019 | Naohara et al. | | |
| 2019/0243330 A1 | 8/2019 | Naohara et al. | | |
| 2020/0211870 A1 | 7/2020 | Takayama et al. | | |
| 2020/0232873 A1* | 7/2020 | Nagase | ................ | G05D 7/0635 |
| 2020/0312697 A1 | 10/2020 | Ito et al. | | |
| 2020/0348158 A1* | 11/2020 | Sugita | ................. | G05D 7/0635 |
| 2020/0363826 A1* | 11/2020 | Tanno | ................ | F16K 31/1245 |
| 2021/0375655 A1 | 12/2021 | Endo et al. | | |
| 2022/0413478 A1 | 12/2022 | Nozuki et al. | | |

FOREIGN PATENT DOCUMENTS

| | | | |
|---|---|---|---|
| CN | 108074832 A | 5/2018 | |
| CN | 108735631 A | 11/2018 | |
| JP | 2003-059887 A | 2/2003 | |
| JP | 2005-142467 A | 6/2005 | |
| JP | 2006-281421 A | 10/2006 | |
| JP | 4064402 B2 | 3/2008 | |
| JP | 2010225632 A | 10/2010 | |
| JP | 2013-040774 A | 2/2013 | |
| JP | 2017-181297 A | 10/2017 | |
| JP | 2018049994 A | 3/2018 | |
| JP | 2018077764 A | 5/2018 | |
| JP | 2018157042 A | 10/2018 | |
| JP | 2019057583 A | 4/2019 | |
| JP | 2019140194 A | 8/2019 | |
| JP | 2019140195 A | 8/2019 | |
| JP | 2020107803 A | 7/2020 | |
| JP | 2020167189 A | 10/2020 | |
| JP | 2020-198357 A | 12/2020 | |
| JP | 2021034686 A | 3/2021 | |
| KR | 10-2009-0051531 A | 5/2009 | |
| KR | 10-2017-0095748 A | 8/2017 | |
| KR | 10-2018-0053230 A | 5/2018 | |
| KR | 10-2020-0138041 A | 12/2020 | |
| TW | 202025361 A | 7/2020 | |
| WO | WO 2021/0198357 A1 | 2/2021 | |

OTHER PUBLICATIONS

Decision to Grant a Patent dated Apr. 25, 2025 for corresponding Korean Patent Application No. 10-2022-0115683.
Office Action dated May 27, 2025 in corresponding Chinese Patent Application No. 202211142052.3.

* cited by examiner

F I G.  1
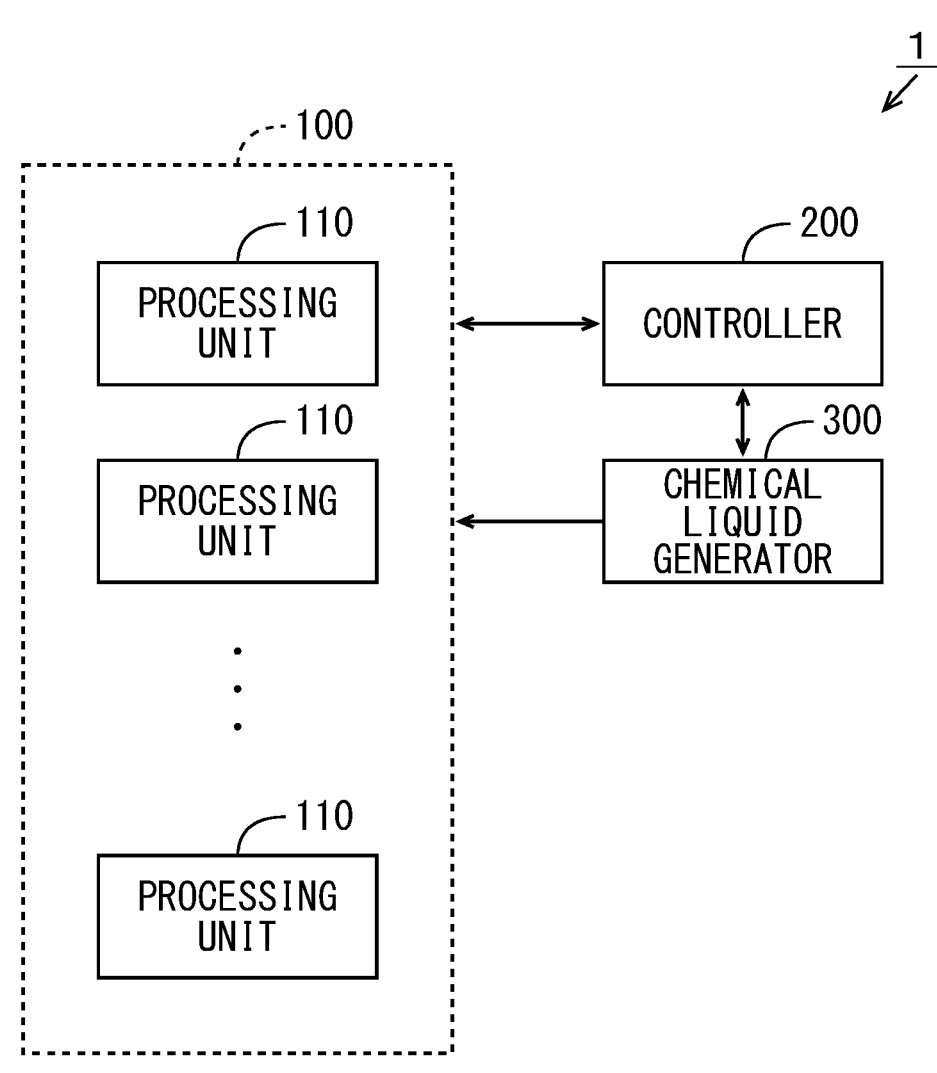

F I G.  4
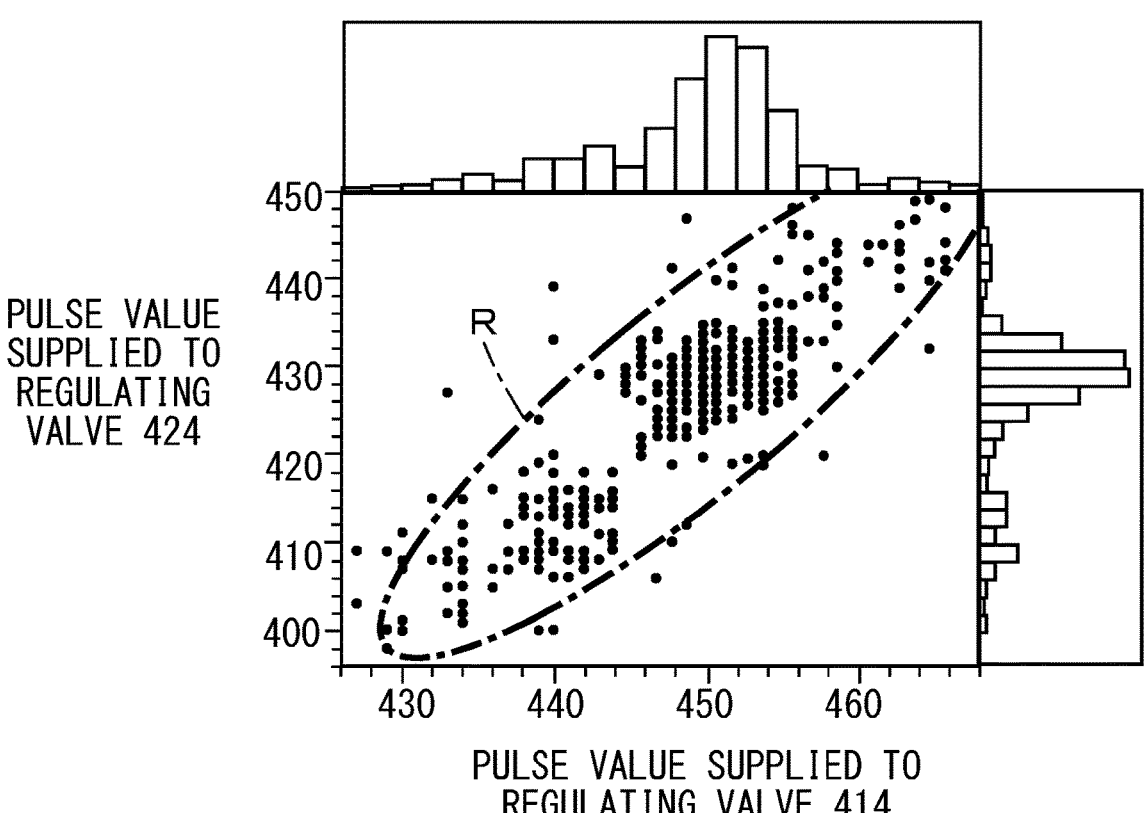
PULSE VALUE
SUPPLIED TO
REGULATING
VALVE 424
PULSE VALUE SUPPLIED TO
REGULATING VALVE 414

F I G. 6
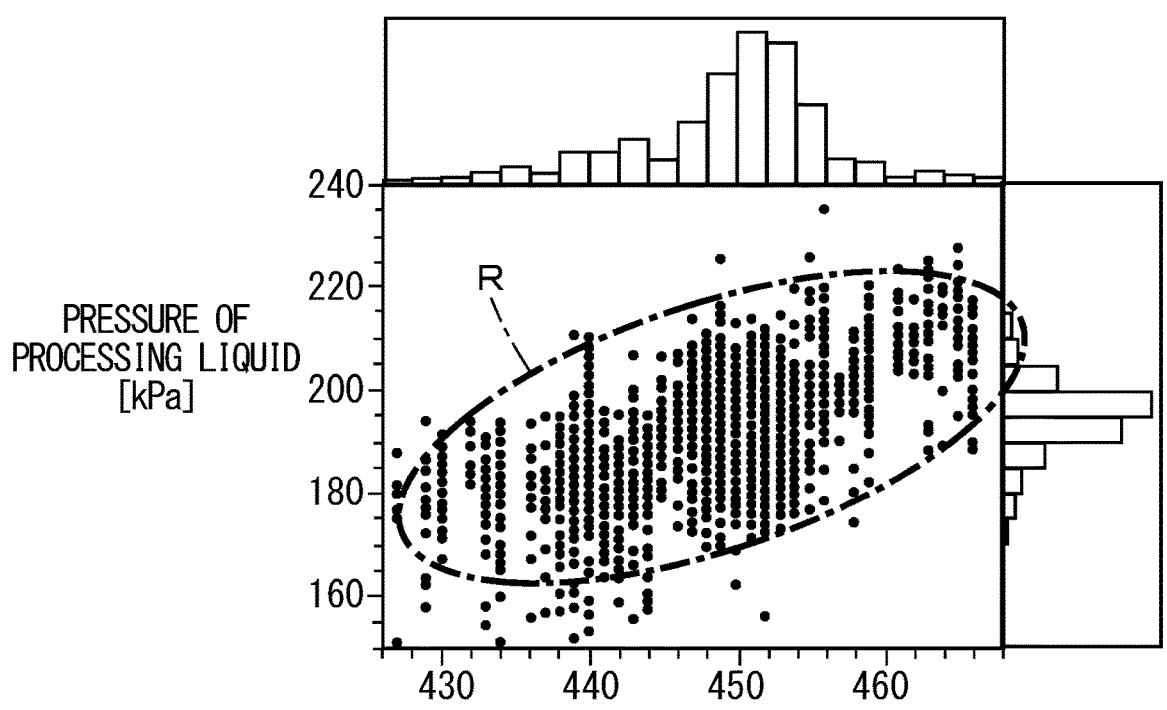
PRESSURE OF PROCESSING LIQUID [kPa]
PULSE VALUE SUPPLIED TO REGULATING VALVE 414

F I G. 7
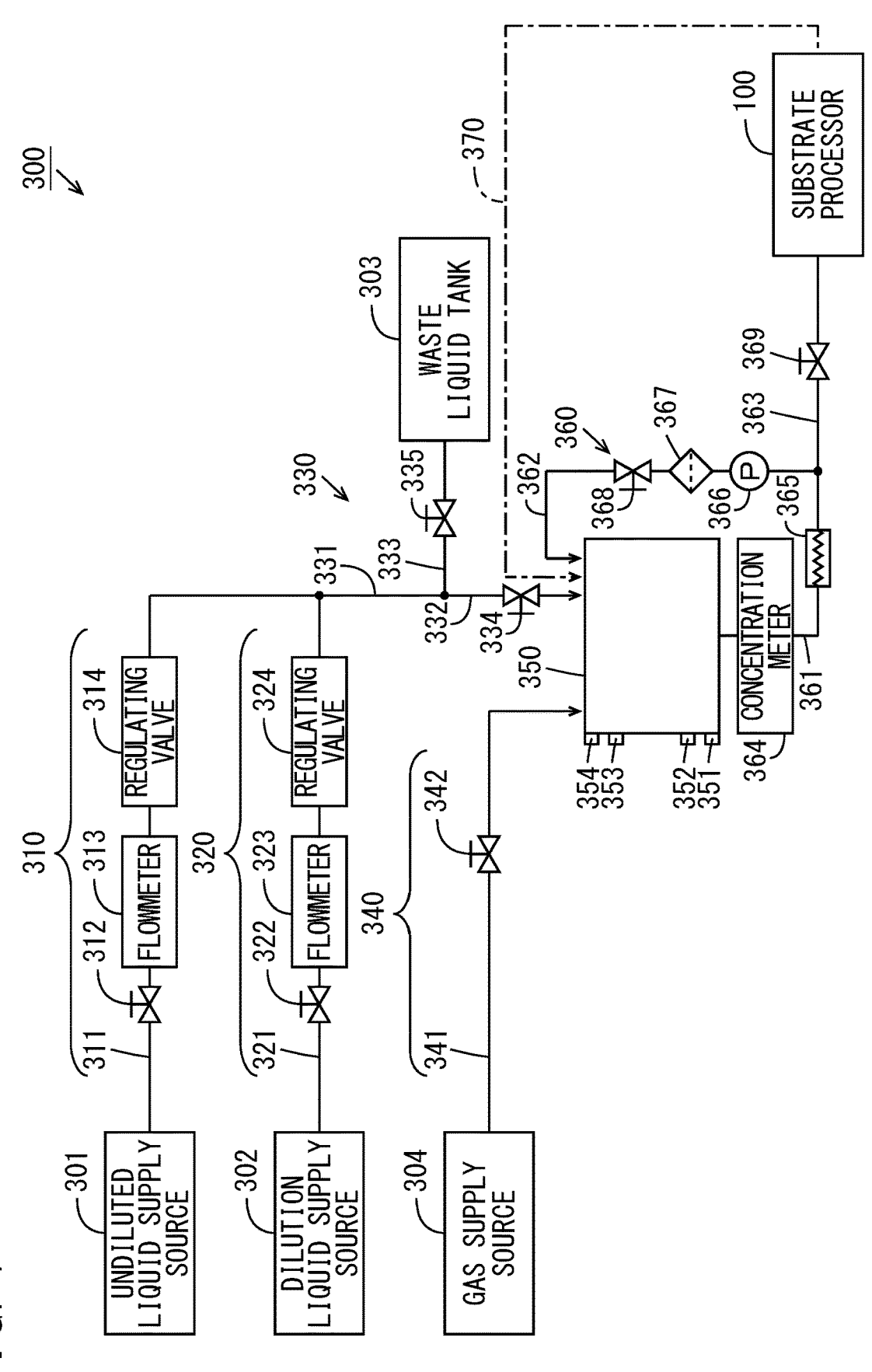

F I G.  8
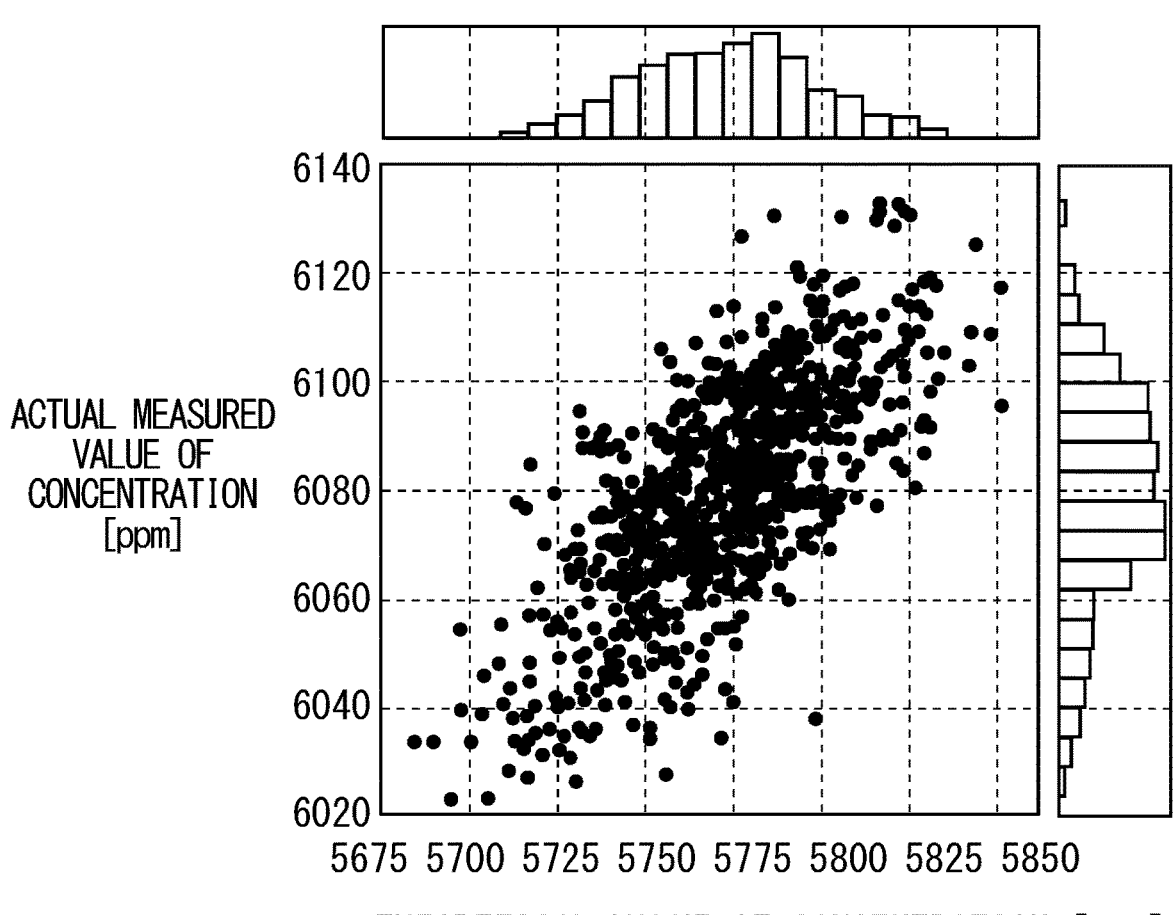

F I G. 9
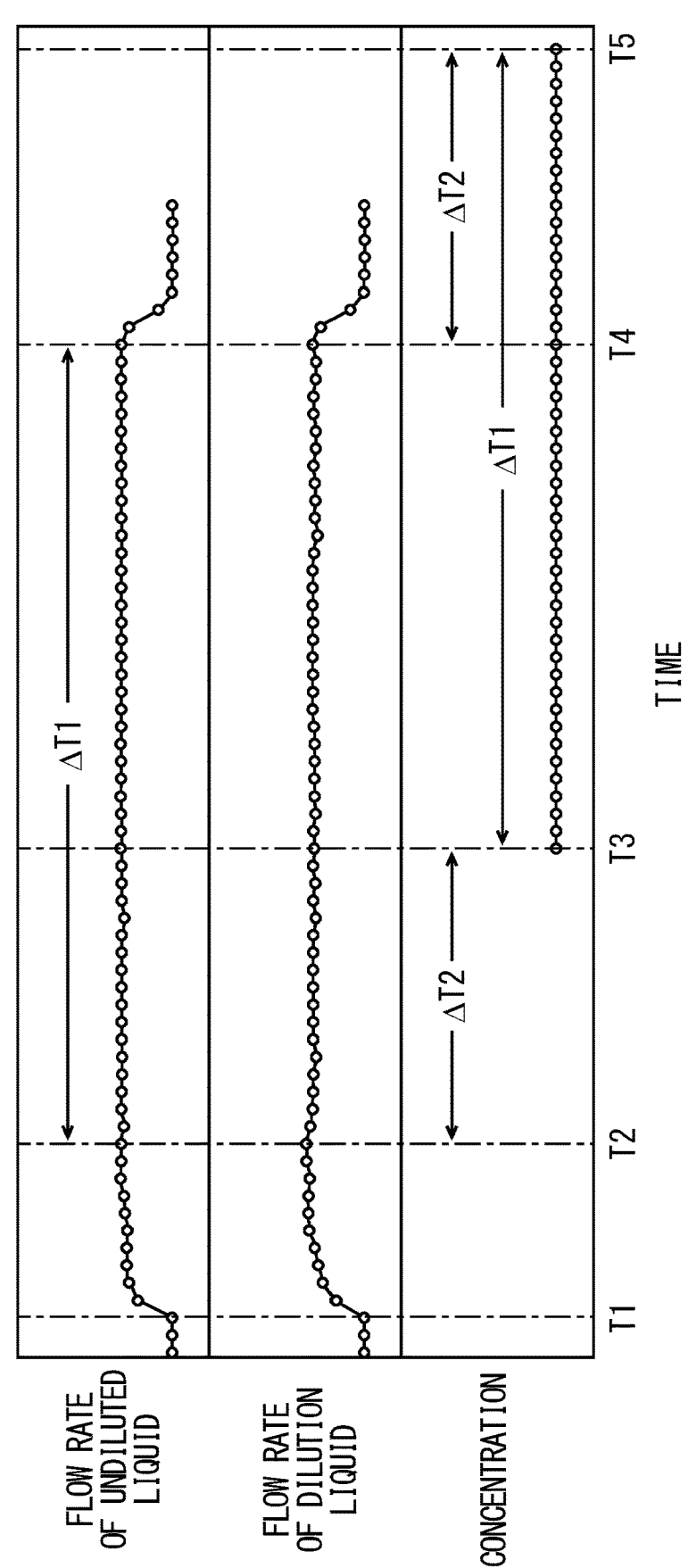

F I G . 1 0
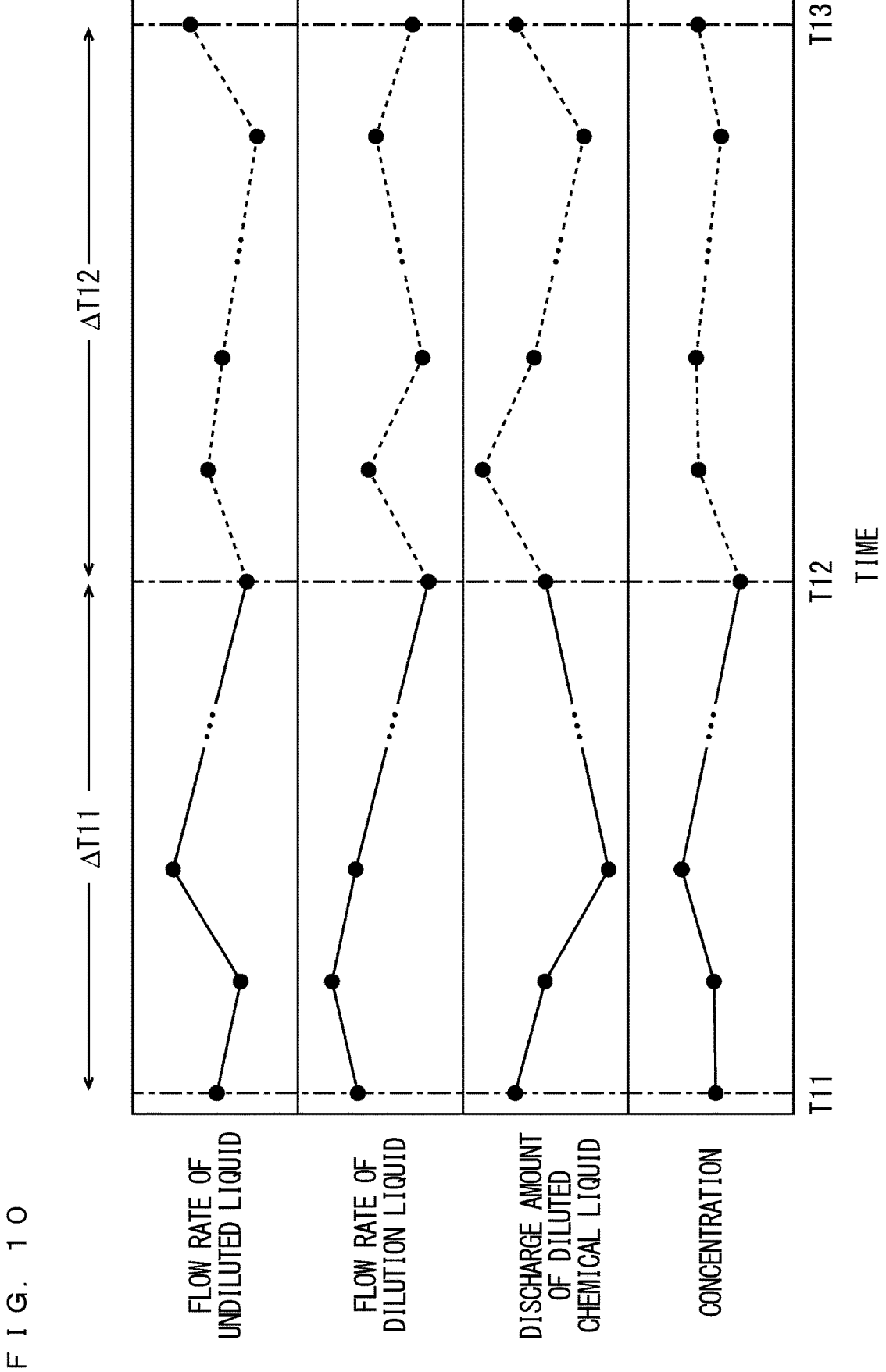

F I G. 1 1
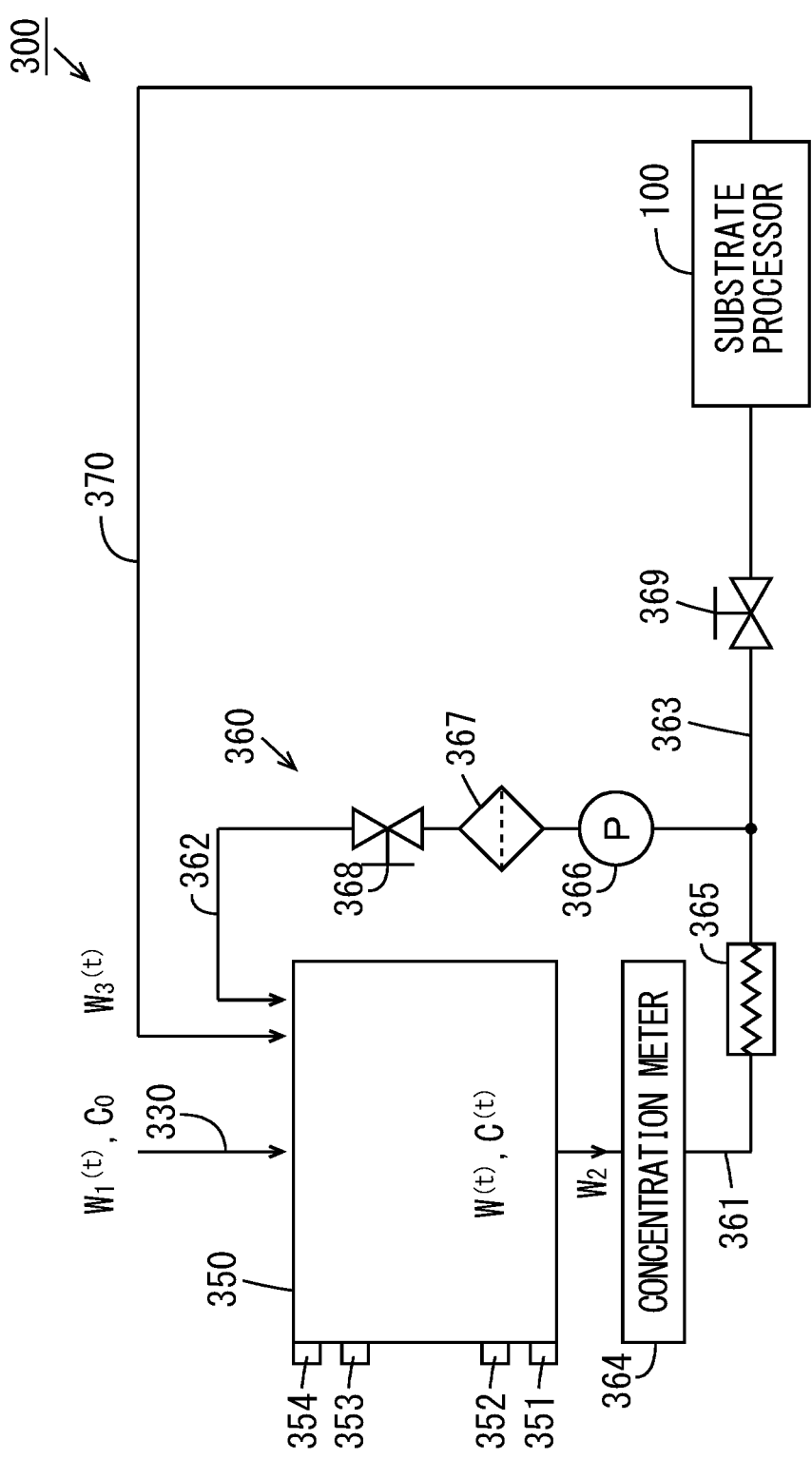

F I G. 1 3
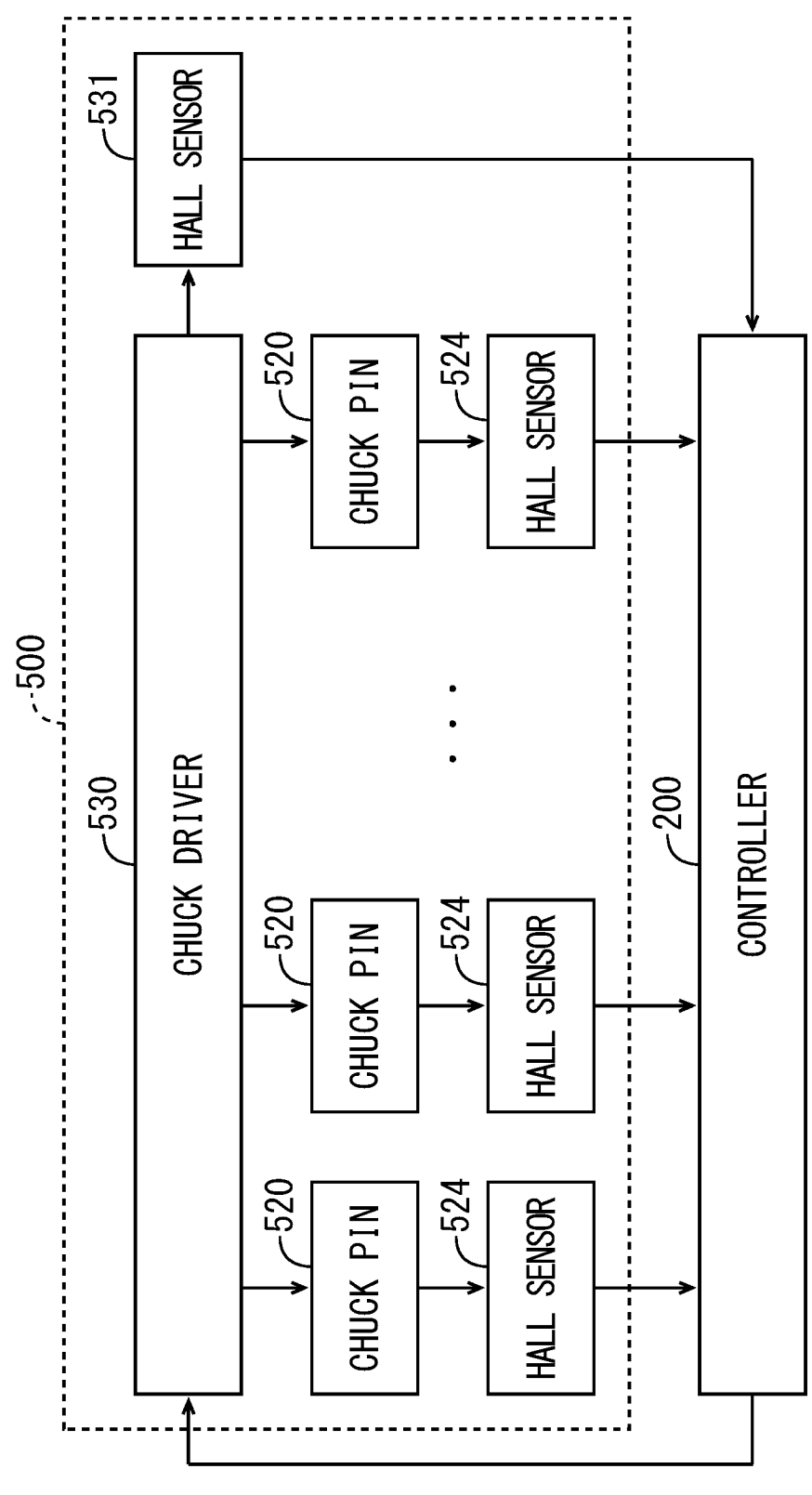

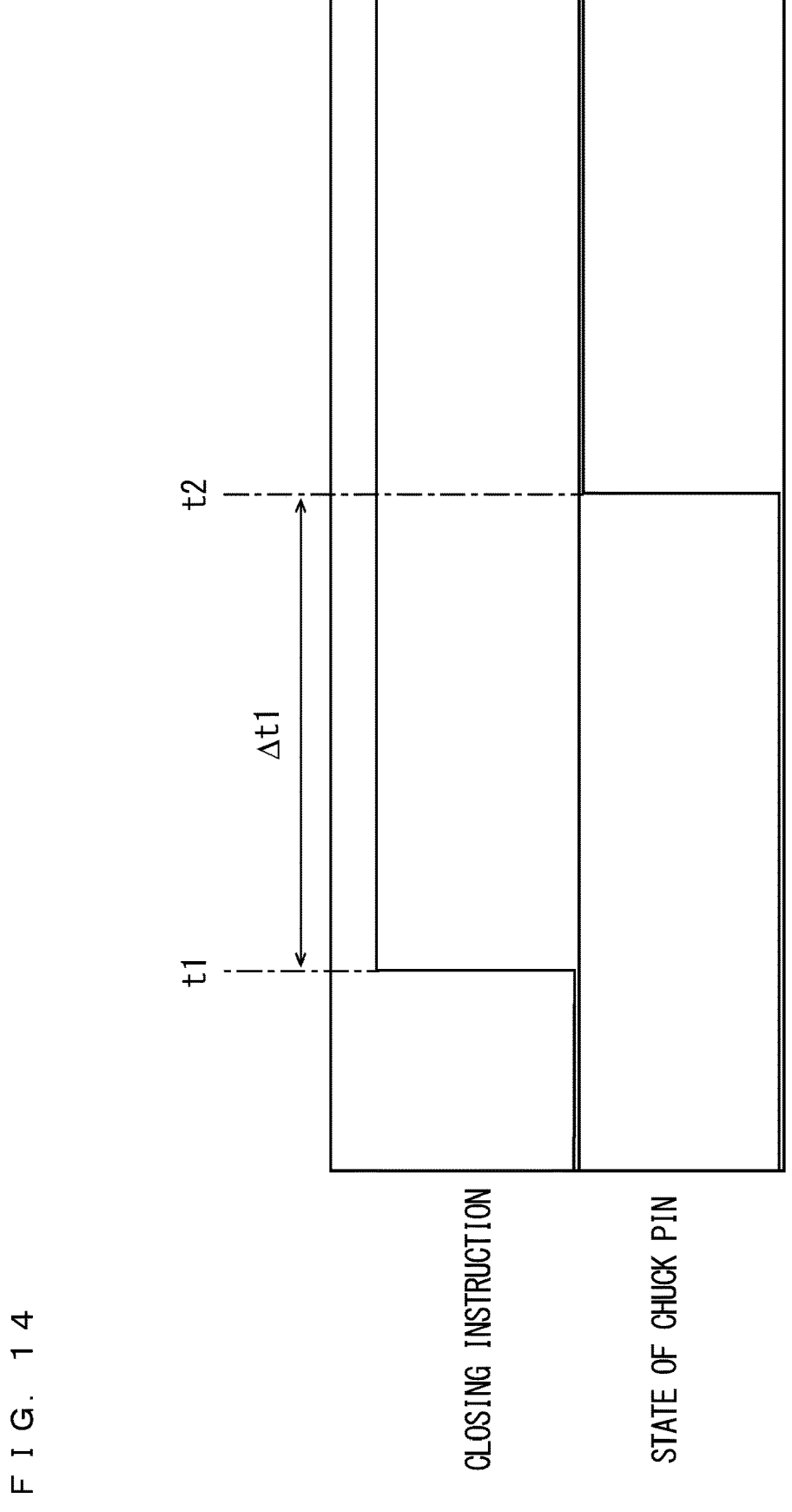
F I G.  1 4

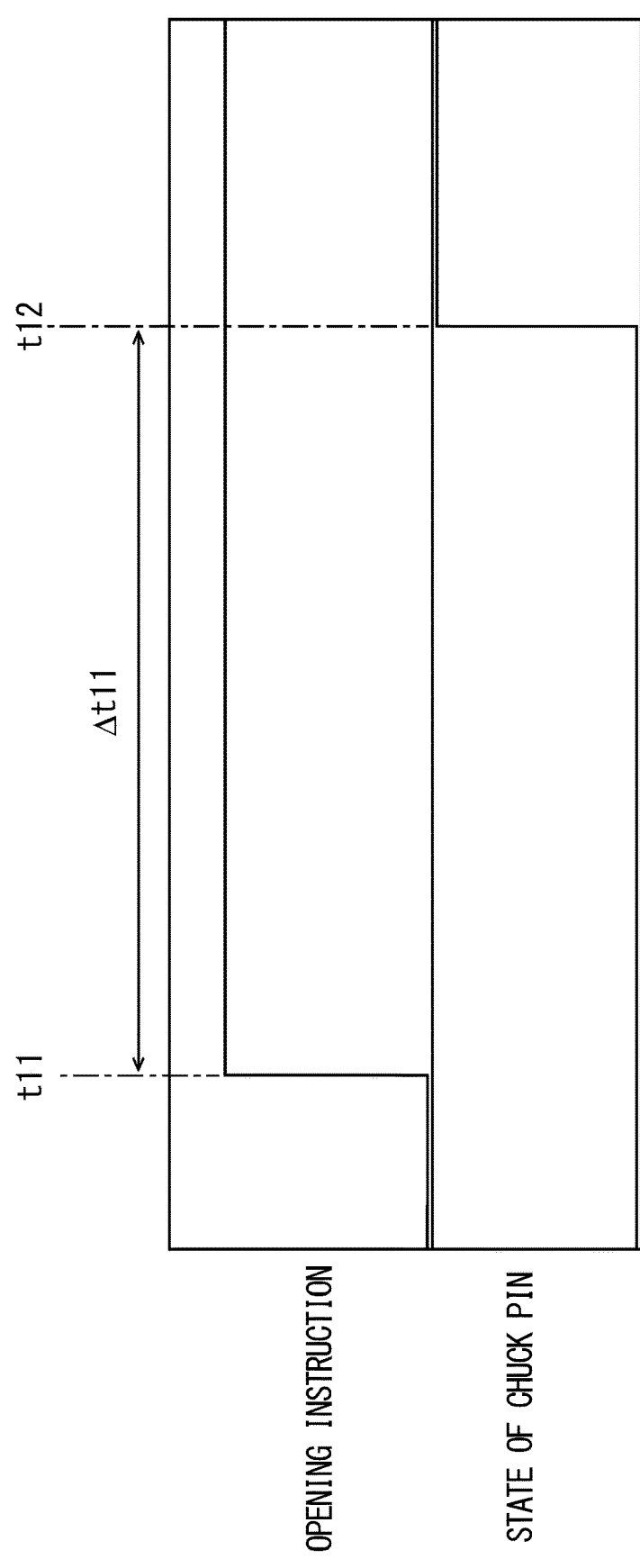
F I G. 1 5

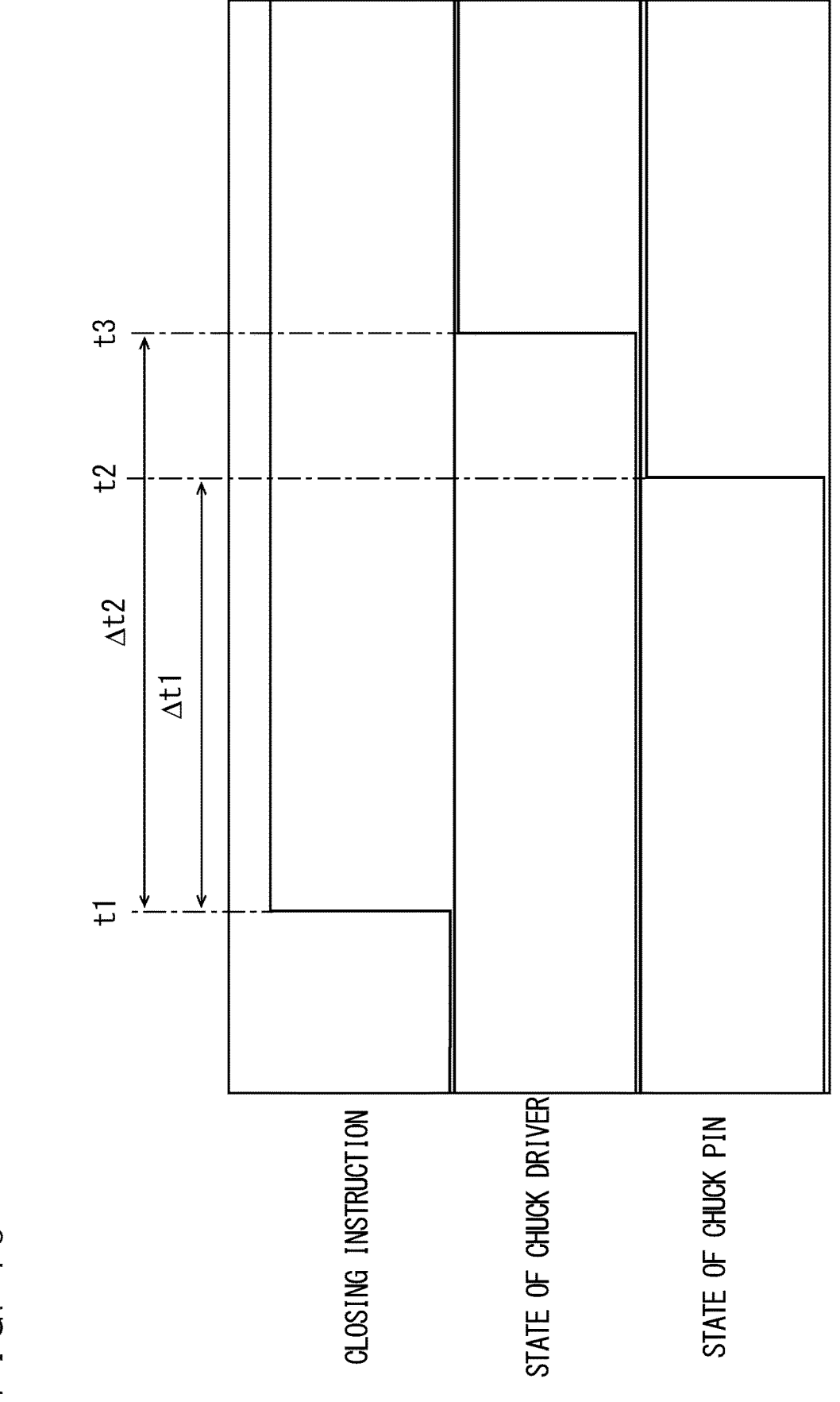
F I G. 1 6

F I G. 1 7
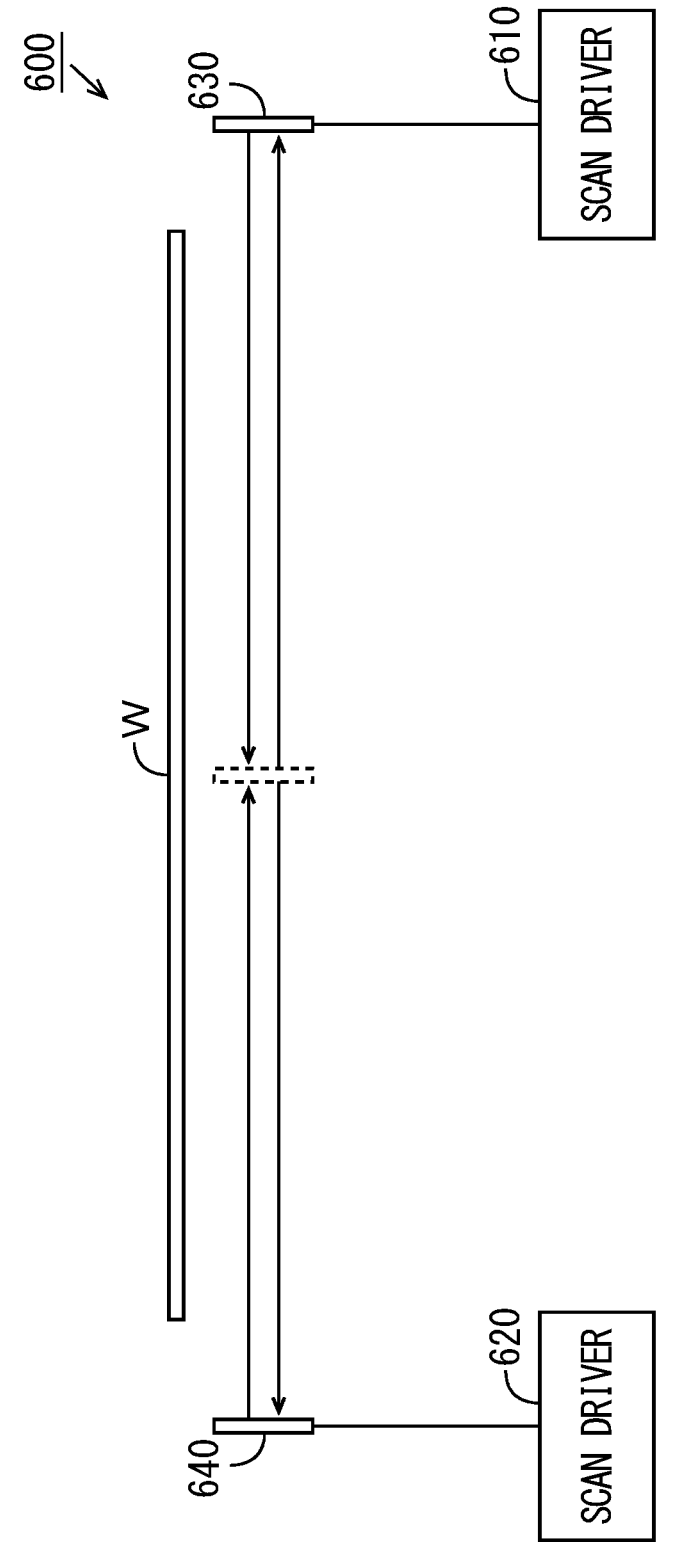

F I G .  1 8
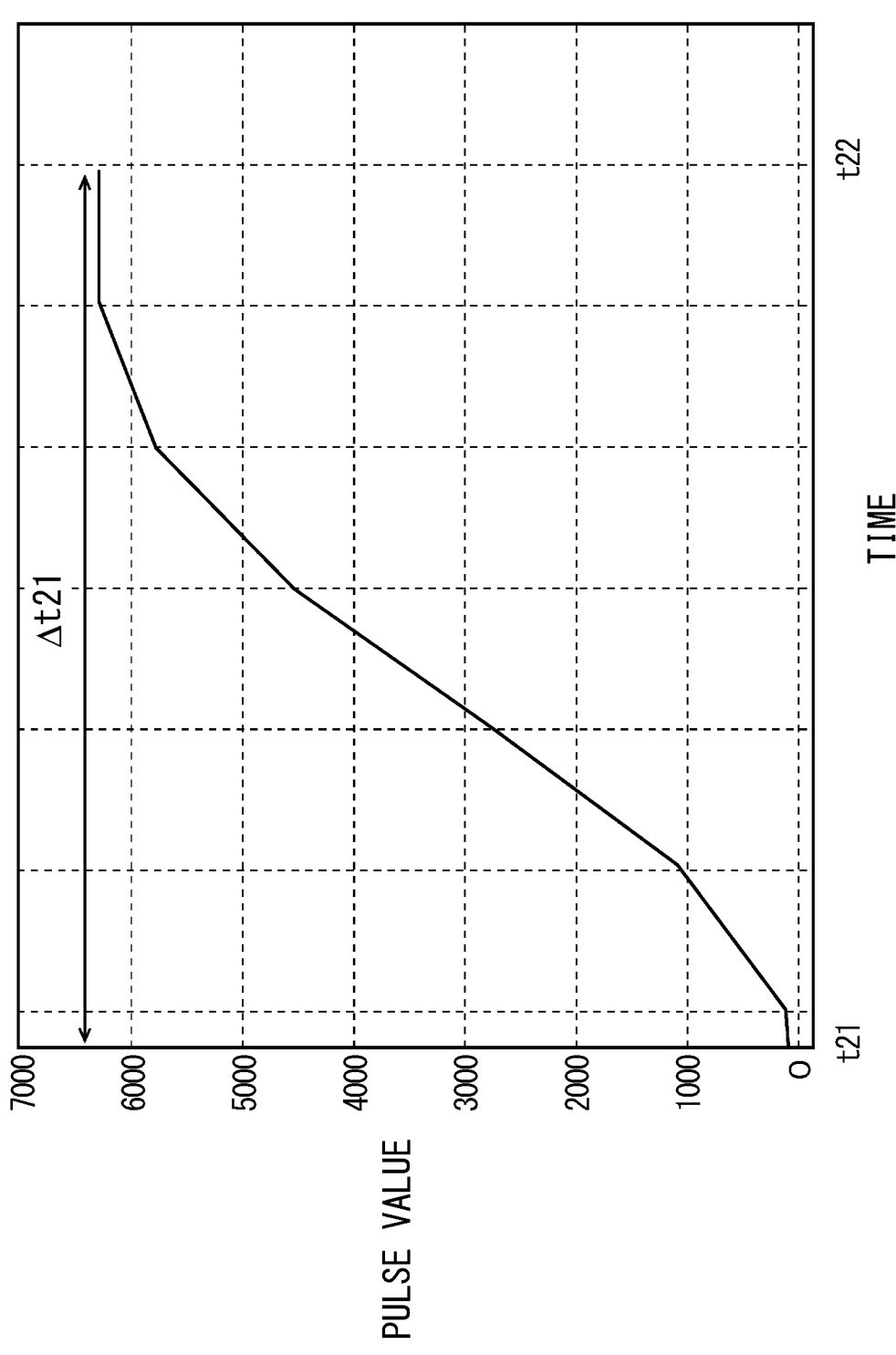

F I G.  1 9
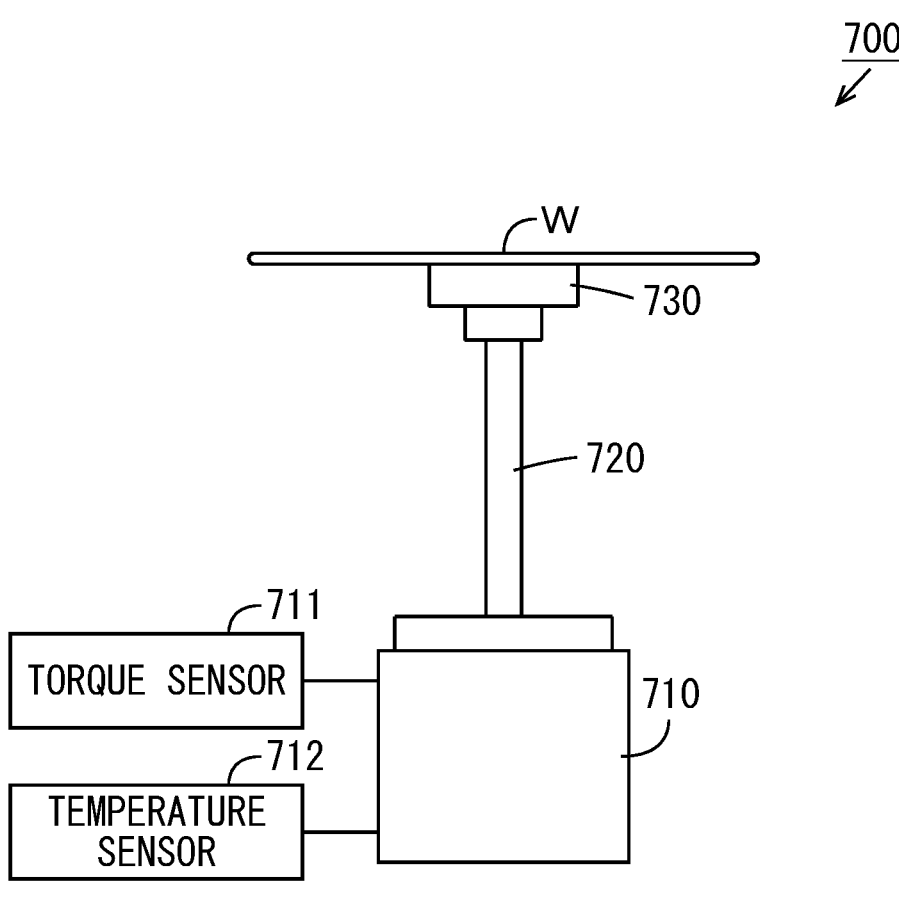

F I G.  2 1
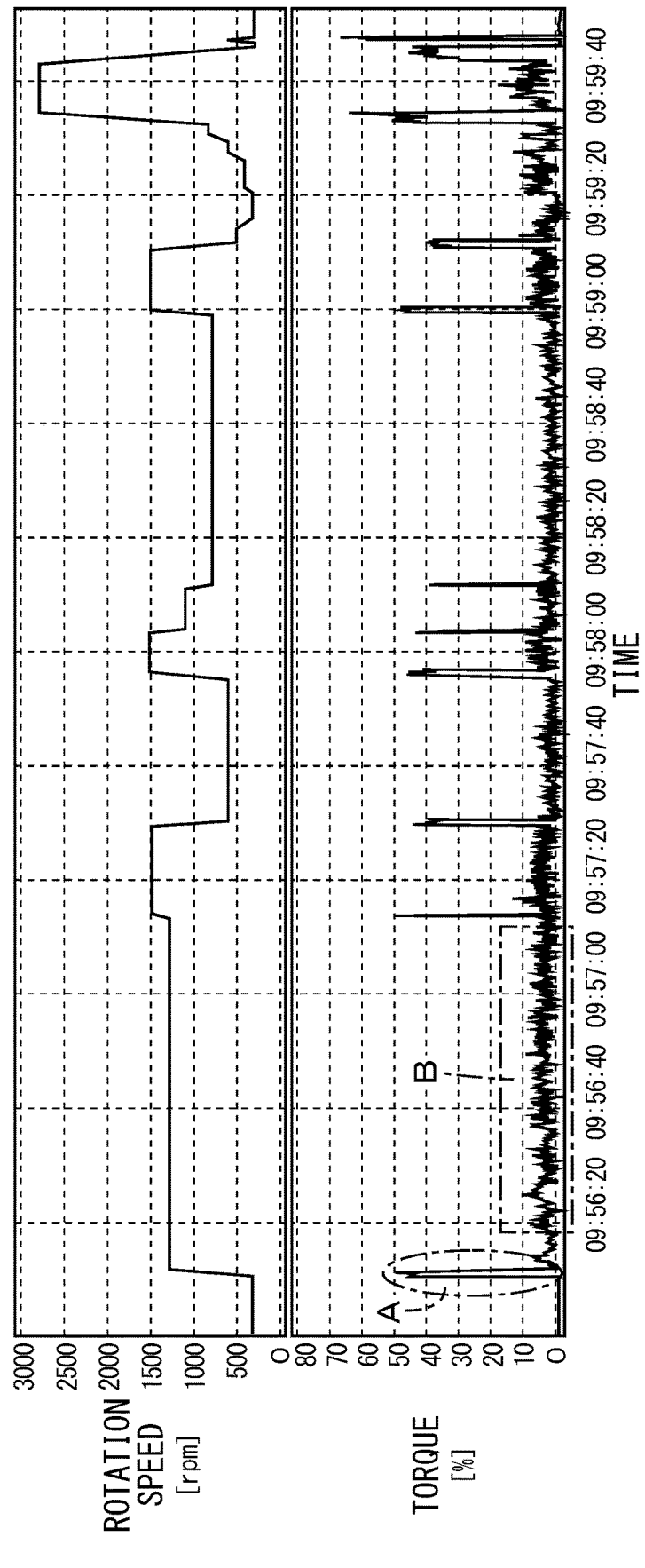

F I G . 2 2
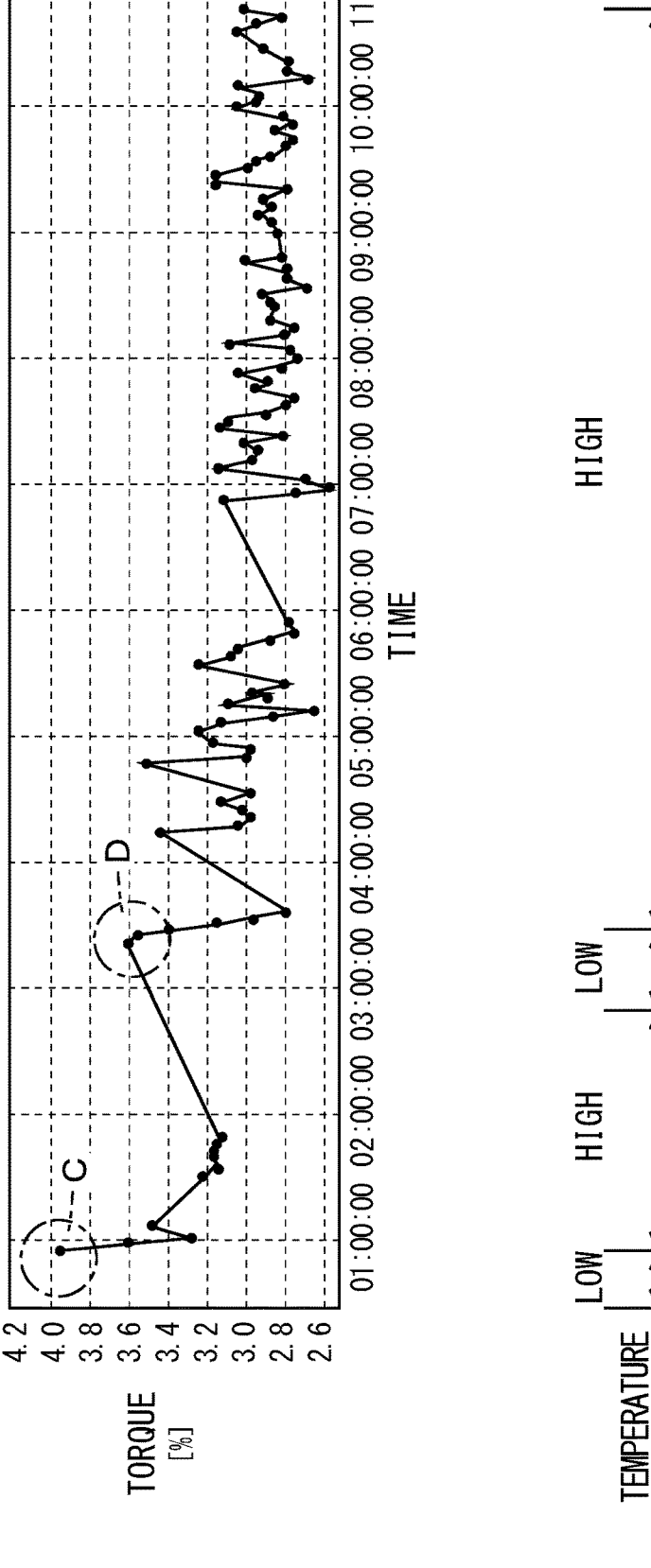

F I G. 2 3
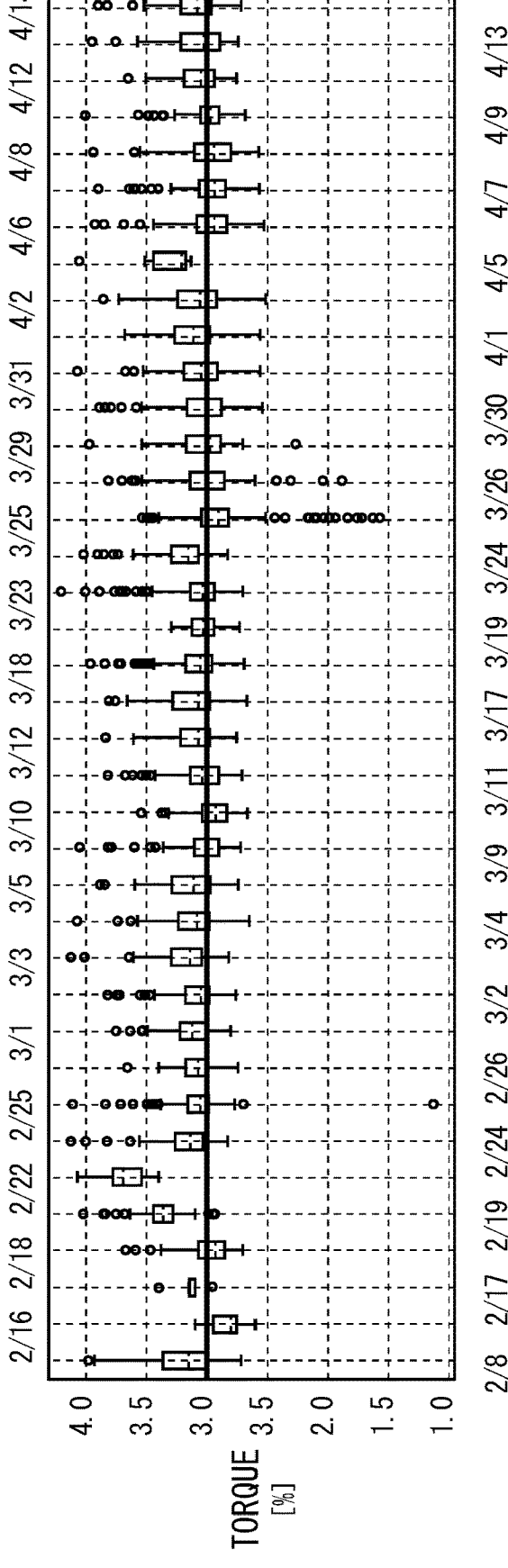

F I G. 2 4
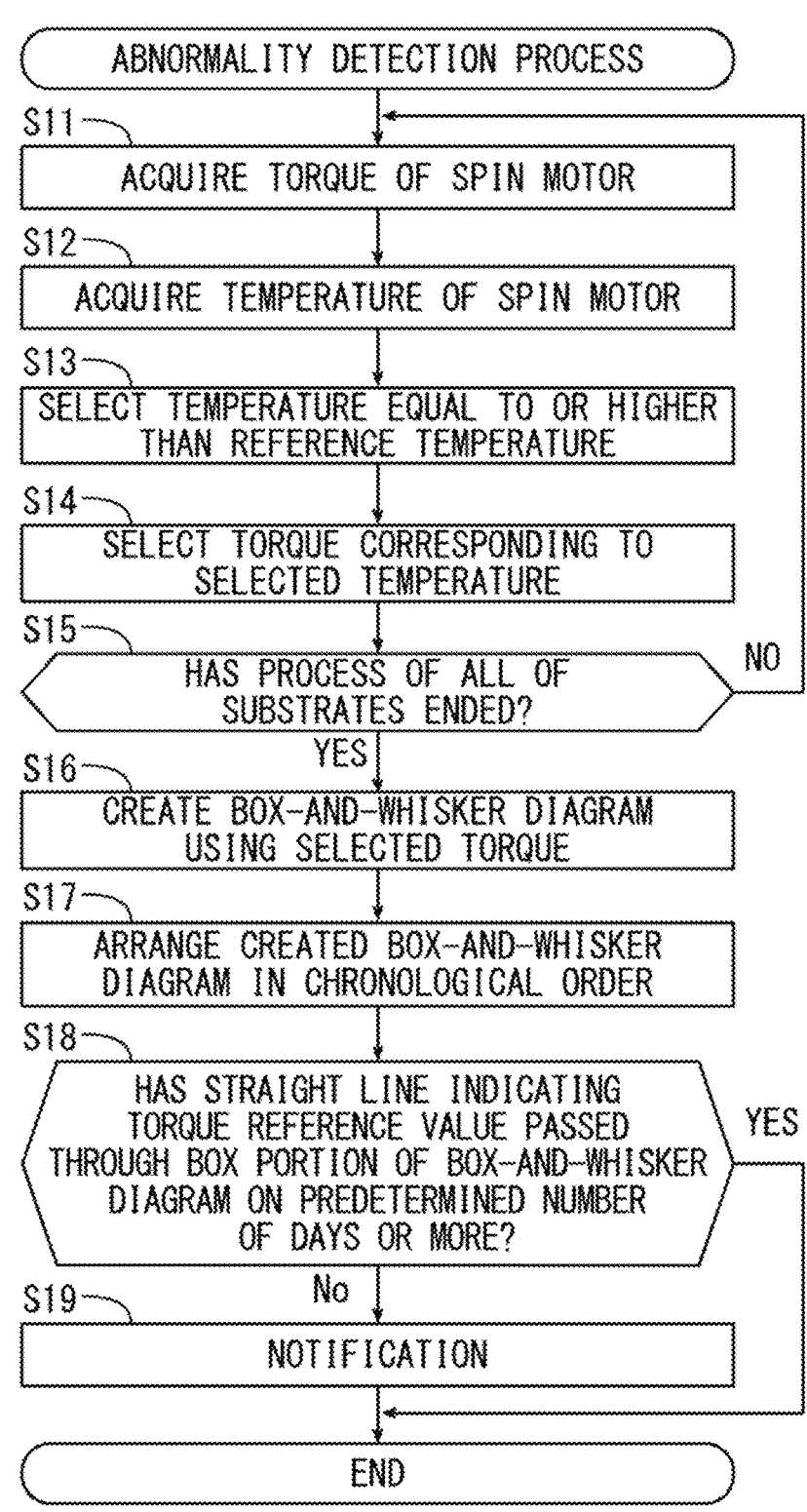

SUBSTRATE PROCESSING APPARATUS, ABNORMALITY DETECTION METHOD AND NON-TRANSITORY COMPUTER READABLE MEDIUM STORING ABNORMALITY DETECTION PROGRAM

BACKGROUND

Technical Field

The present invention relates to a substrate processing apparatus that processes a substrate, an abnormality detection method and a non-transitory computer readable medium storing an abnormality detection program.

Description of Related Art

A substrate processing apparatus is used to perform various processes such as film formation, development and cleaning on a substrate such as a semiconductor substrate, a glass substrate for a liquid crystal display device, a glass substrate for a photomask or a glass substrate for an optical disc. In a case in which the substrate processing apparatus is operated for a long period of time, an abnormality such as damage or deterioration of an operation component of the substrate processing apparatus may occur.

JP 2018-77764 A describes an abnormality detection device that can predict an abnormality in a semiconductor manufacturing apparatus. In this abnormality detection apparatus, state information representing the state of each component of the semiconductor manufacturing apparatus is collected in a predetermined period. The state information includes a temperature, a pressure, a gas flow rate, electric power or the like of each component of the semiconductor manufacturing apparatus. The collected state information is stored as a log for each predetermined unit.

A monitoring band for monitoring the state of each component of the semiconductor manufacturing apparatus is generated based on a stored log. The monitoring band is a waveform used when it is determined whether the collected state information is normal, and is generated by interpolation based on an upper limit value and a lower limit value set for each predetermined period, for example. Whether the state of each component of the semiconductor manufacturing apparatus is abnormal is determined based on the state information and the monitoring band.

SUMMARY

As in the abnormality detection apparatus described in JP 2018-77464 A, it is desired to detect an abnormality before a substrate processing apparatus fails.

An object of the present invention is to provide a substrate processing apparatus and an abnormality detection method that enable detection of an abnormality at an early stage, and a computer-readable medium storing an abnormality detection program.

(1) A substrate processing apparatus according to one aspect of the present invention that includes a first operation component and a second operation component that are used in a substrate process with use of a processing liquid, includes an operation value acquirer that acquires a first operation value of the first operation component and a second operation value of the second operation component, and an abnormality determiner that determines whether an abnormality has occurred based on a correlation between the first operation value and the second operation value that are acquired by the operation value acquirer.

In this substrate processing apparatus, a substrate is processed with use of a processing liquid. Further, it is determined whether an abnormality has occurred based on the correlation between the first operation value of the first operation component and the second operation value of the second operation component. Therefore, it is possible to detect an abnormality in the substrate processing apparatus at an early stage before the substrate processing apparatus fails.

(2) The abnormality determiner may determine whether an abnormality has occurred based on a ratio of datapoints exceeding an allowable range defined based on a correlation between the first operation value and the second operation value to datapoints defined by sets of the first operation value and the second operation value that are acquired by the operation value acquirer. In this case, it is possible to detect an abnormality in the substrate processing apparatus in a simple process.

(3) The allowable range may be defined so as to include a predetermined ratio of datapoints out of datapoints defined by sets of the first operation value and the second operation value that are acquired in advance by the operation value acquirer before a substrate process. In this case, it is possible to easily determine the allowable range used for determination in regard to an abnormality.

(4) The abnormality determiner may determine whether an abnormality has occurred each time a predetermined number of substrates are processed or a predetermined period of time elapses. With this configuration, an abnormality in the substrate processing apparatus is detected at an early stage easily.

(5) The first operation component may include a first regulating valve that regulates a flow rate of a processing liquid to be supplied to the substrate based on a first pulse value, the second operation component may include a second regulating valve that regulates a flow rate of a processing liquid to be supplied to the substrate based on a second pulse value, the first operation value may be the first pulse value supplied to the first regulating valve, and the second operation value may be the second pulse value supplied to the second regulating valve.

In this case, it is possible to detect an abnormality in the substrate processing apparatus at an early stage based on the correlation between a pulse value supplied to the first regulating valve and a pulse value supplied to the second regulating valve.

(6) The first operation component may include a regulating valve that regulates a flow rate of a processing liquid to be supplied to the substrate based on a pulse value, the second operation component may include a manometer that detects a pressure of a processing liquid to be guided to the regulating valve, the first operation value may be the pulse value supplied to the regulating valve, and the second operation value may be a pressure detected by the manometer.

In this case, it is possible to detect an abnormality in the substrate processing apparatus at an early stage based on the correlation between a pulse value supplied to the regulating valve and a pressure detected by the manometer.

(7) The first operation component may include a first flowmeter and a second flowmeter that respectively detect flow rates of a first processing liquid and a second processing liquid, the second operation component may include a concentration meter that detects a concentration of a processing liquid mixture generated by mixing of the first processing liquid and the second processing liquid, the first operation value may be a theoretical value of concentration of the processing liquid mixture calculated based on a ratio between a flow rate of the first processing liquid and a flow rate of the second processing liquid that are respectively detected by the first flowmeter and the second flowmeter, and the second operation value may be an actual measured value of concentration of the processing liquid mixture detected by the concentration meter.

In this case, it is possible to detect an abnormality in the substrate processing apparatus at an early stage based on the correlation between a theoretical value of concentration of the processing liquid mixture calculated based on the ratio between the flow rate of the first processing liquid and the flow rate of the second processing liquid, and an actual measured value of concentration of the processing liquid mixture detected by the concentration meter.

(8) The substrate processing apparatus may further include a storage into which a processing liquid mixture in which a first processing liquid and a second processing liquid are mixed flows, the first operation component may include a first flowmeter and a second flowmeter that respectively detect flow rates of the first processing liquid and the second processing liquid, the second operation component may include a concentration meter that detects a concentration of the processing liquid mixture that flows out from the storage, the processing liquid mixture that has flowed into the storage may arrive at the concentration meter in a first period of time, the first operation value may be a theoretical value of concentration of the processing liquid mixture that is calculated based on an integrated value of flow rates of the first processing liquid and an integrated value of flow rates of the second processing liquid, the flow rates being respectively detected by the first flowmeter and the second flowmeter in a period from a first point in time to a second point in time at which a second period of time has elapsed from the first point in time, and the second operation value may be a statistical value of concentrations of the processing liquid mixture detected by the concentration meter in a period from a third point in time at which the first period of time has elapsed from the first point in time to a fourth point in time at which the first period of time has elapsed from the second point in time.

In this case, it is determined whether an abnormality has occurred in the substrate processing apparatus based on the correlation between a theoretical value of concentration of the processing liquid mixture calculated based on an integrated value of the flow rate of the first processing liquid and an integrated value of the flow rate of the second processing liquid, and a statistical value of concentration of the processing liquid mixture. Here, because there is the strong correlation between a theoretical value of concentration of the processing liquid mixture and a statistical value of concentration of the processing liquid mixture, described above, it is possible to detect an abnormality in the substrate processing apparatus more reliably.

(9) The first operation component may include a first flowmeter and a second flowmeter that respectively detect flow rates of a first processing liquid and a second processing liquid, the second operation component may include a concentration meter that detects a concentration of a processing liquid mixture generated by mixing of the first processing liquid and the second processing liquid, a concentration predictive model, which is obtained by machine learning of a relationship between flow rates of the first processing liquid, flow rates of the second processing liquid and concentrations of the processing liquid mixture in a period from a first point in time to a second point in time at which a first period of time has elapsed from the first point in time, and a concentration of the processing liquid mixture at a third point in time at which a second period of time has elapsed from the second point in time, may be prepared, the first operation value may be a predicted value of concentration of the processing liquid mixture at a sixth point in time at which the second period of time has elapsed from a fifth point in time, the predicted value being acquired by application of flow rates of the first processing liquid detected by the first flowmeter, flow rates of the second processing liquid detected by the second flowmeter and concentrations of the processing liquid mixture detected by the concentration meter in a period from a fourth point in time to the fifth point in time at which the first period of time has elapsed from the fourth point in time to the concentration predictive model, and the second operation value may be an actual measured value of concentration of the processing liquid mixture that is detected by the concentration meter at the sixth point in time.

In this case, it is possible to detect a single abnormality that occurs in the substrate processing apparatus in a relatively short period of time based on the correlation between a predicted value of concentration of the processing liquid mixture acquired based on the concentration predictive model and an actual measured value of concentration of the processing liquid mixture detected by the concentration meter.

(10) The substrate processing apparatus may further include a storage that stores a processing liquid mixture in which a first processing liquid and a second processing liquid are mixed, a substrate processor that processes a substrate using the processing liquid mixture, a first flow path portion that guides the processing liquid mixture while mixing the first processing liquid and the second processing liquid to generate the processing liquid mixture, a second flow path portion that guides the processing liquid mixture stored in the storage to the substrate processor, and a third flow path portion that guides the processing liquid mixture that has not been used in the substrate processor to the storage, the first operation component may include a first flowmeter and a second flowmeter that respectively detect flow rates of the first processing liquid and the second processing liquid, the second operation component may include a concentration meter that detects a concentration of the processing liquid mixture that flows out from the storage, the processing liquid mixture that has flowed into the storage through the first flow path portion may arrive at the concentration meter in a first period of time, the first operation value may be a theoretical value of concentration of the processing liquid mixture stored in the storage at each point in time, the theoretical value being calculated based on a volume of the processing liquid mixture that flows into the storage through the first flow path portion, a volume of the processing liquid mixture that flows out from the storage through the second flow path portion and a volume of the processing liquid mixture that flows into the storage through the third flow path portion, per unit time, and a flow rate of the first processing liquid and a flow rate of the second processing liquid that are respectively detected by the first flowmeter and the second flowmeter, and the second operation value may be an actual measured value of concentration of the processing liquid mixture detected by the concentration meter at a point in time at which the first period of time has elapsed from a point in time at which the processing liquid mixture flows into the storage through the first flow path portion.

In a case in which the concentration of the processing liquid mixture supplied to the substrate processor changes, an unused processing liquid mixture in the substrate processor is returned to the storage. Thus, the concentration of the processing liquid mixture stored in the storage changes. Even in this case, with the above-mentioned configuration, whether an abnormality has occurred in the substrate processing apparatus is determined based on the correlation between a theoretical value of concentration of the processing liquid mixture stored in the storage calculated based on a volume of the processing liquid mixture flowing into or out of the storage, the flow rate of the first processing liquid and the flow rate of the second processing liquid, and an actual measured value of concentration of the processing liquid mixture detected by the concentration meter. In this case, it is possible to strengthen the correlation between a theoretical value of concentration of the processing liquid mixture and a statistical value of concentration of the processing liquid mixture. Therefore, it is possible to detect an abnormality in the substrate processing apparatus more reliably.

(11) The first operation component may include a first chuck pin that transitions between a first close state in which the first operation component holds the substrate and a first open state in which the first operation component does not hold the substrate, the second operation component may include a second chuck pin that transitions between a second close state in which the second operation component holds the substrate and a second open state in which the second operation component does not hold the substrate, the first operation value may be a transition period of time in which the first chuck pin transitions between the first close state and the first open state, and the second operation value may be a transition period of time in which the second chuck pin transitions between the second close state and the second open state.

In this case, it is possible to detect an abnormality in the substrate processing apparatus at an early stage based on the correlation between a transition period of time of the first chuck pin and a transition period of time of the second chuck pin.

(12) The first operation component may include a chuck pin that transitions between a first close state in which the first operation component holds the substrate and a first open state in which the first operation component does not hold the substrate, the second operation component may include a chuck driver that transitions between a second close state in which the chuck pin transitions to the first close state and a second open state in which the chuck pin transitions to the first open state, the first operation value may be a transition period of time between the first close state and the first open state for the chuck pin, and the second operation value may be a transition period of time between the second close state and the second open state for the chuck driver.

In this case, it is possible to detect an abnormality in the substrate processing apparatus at an early stage based on the correlation between a transition period of time of the chuck pin and a transition period of time of the chuck driver.

(13) The first operation component may include a first processor that moves between a first waiting position at which the first operation component does not process the substrate and a first processing position at which the first operation component processes the substrate, the second operation component may include a second processor that moves between a second waiting position at which the second operation component does not process the substrate and a second processing position at which the second operation component processes the substrate, the first operation value may be a movement period of time in which the first processor moves between the first waiting position and the first processing position, and the second operation value may be a movement period of time in which the second processor moves between the second waiting position and the second processing position.

In this case, it is possible to detect an abnormality in the substrate processing apparatus at an early stage based on the correlation between a moving period of time of the first processor and a moving period of time of the second processor.

(14) The substrate processing apparatus may further include an operation value selector that selects a second operation value that satisfies a predetermined standard out of the second operation values acquired by the operation value acquirer and selects a first operation value corresponding to the second operation value selected out of the first operation values acquired by the operation value acquirer, wherein the abnormality determiner may determine whether an abnormality has occurred based on a change of a time series of a first operation value selected by the operation value selector.

In this case, it is determined whether an abnormality has occurred based on the change of a time-series of the first operation value satisfying a predetermined standard out of the acquired first operation values. Therefore, it is possible to detect an abnormality in the substrate processing apparatus reliably.

(15) The first operation component may include a torque sensor that detects a torque of a spin driver, the second operation component may include a temperature sensor that detects a temperature of the spin driver, the first operation value may be a torque of the spin driver detected by the torque sensor, and the second operation value may be a temperature of the spin driver detected by the temperature sensor.

In this case, it is possible to easily select a torque satisfying a predetermined standard out of the torques of the spin driver detected by the torque sensor based on a temperature of the spin driver detected by the temperature sensor. Therefore, it is possible to detect an abnormality in the substrate processing apparatus easily.

(16) The first operation value may be a torque acquired when the spin driver is rotating at a predetermined constant rotation speed out of torques of the spin driver detected by the torque sensor, and the second operation value may be a temperature acquired when the spin driver is rotating at the constant rotation speed out of temperatures of the spin driver detected by the temperature sensor. In this case, it is possible to detect an abnormality in the substrate processing apparatus more accurately.

(17) An abnormality detection method according to another aspect of the present invention of detecting an abnormality in a substrate processing apparatus that includes a first operation component and a second operation component that are used in a substrate process with use of a processing liquid, includes acquiring a first operation value of the first operation component and a second operation value of the second operation component that are correlated with each other, and determining whether an abnormality has occurred based on the acquired first operation value and the acquired second operation value.

With this abnormality detection method, it is determined whether an abnormality has occurred based on the correlation between the first operation value of the first operation component and the second operation value of the second operation component in a substrate process with use of a processing liquid. Therefore, it is possible to detect an abnormality in the substrate processing apparatus at an early stage before the substrate processing apparatus fails.

(18) A non-transitory computer readable medium according to yet another aspect of the present invention storing an abnormality detection program that is executed by a processing device and detects an abnormality in a substrate processing apparatus includes a first operation component and a second operation component that are used in a substrate process with use of a processing liquid, the abnormality detection program causes the processing device to perform the processes of acquiring a first operation value of the first operation component and a second operation value of the second operation component that are correlated with each other, and determining whether an abnormality has occurred based on the acquired first operation value and the acquired second operation value.

With this abnormality detection program, whether an abnormality has occurred is determined based on the correlation between the first operation value of the first operation component and the second operation value of the second operation component in a substrate process with use of a processing liquid. Therefore, it is possible to detect an abnormality in the substrate processing apparatus at an early stage before the substrate processing apparatus fails.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 1 is a block diagram showing the schematic configuration of the substrate processing apparatus according to one embodiment of the present invention;

FIG. 4 is a diagram showing a correlation graph;

FIG. 6 is a diagram showing a correlation graph;

FIG. 7 is a diagram showing the configuration of the chemical liquid generator in the second embodiment;

FIG. 8 is a diagram showing a correlation graph;

FIG. 9 is a diagram for explaining an operation value in the third embodiment;

FIG. 10 is a diagram for explaining one example of a procedure for constructing a concentration predictive model;

FIG. 11 is a partially enlarged view of the chemical liquid generator of FIG. 7;

FIG. 13 is a functional block diagram showing the configuration of the rotation holder;

FIG. 14 is a diagram for explaining the transition period of time of the chuck pin when a closing instruction is provided;

FIG. 15 is a diagram for explaining the transition period of time of the chuck pin when an opening instruction is provided;

FIG. 16 is a diagram for explaining the transition periods of time of the chuck pin and the chuck driver;

FIG. 17 is a diagram showing the configuration of a processing liquid supplier;

FIG. 18 is a diagram for explaining the moving period of time of the cleaner;

FIG. 19 is a side view showing the configuration of the rotation holder in the eighth embodiment;

FIG. 21 is a diagram showing the changes of the rotation speed and the torque of the spin driver in a substrate process;

FIG. 22 is a diagram showing the acquired torques and temperatures;

FIG. 23 is a diagram for explaining one example of an abnormality determination method; and FIG. 24 is a flowchart showing an abnormality detection process performed by the controller of FIG. 20.

DETAILED DESCRIPTION

<1> Configuration of Substrate Processing Apparatus

Figure 2:
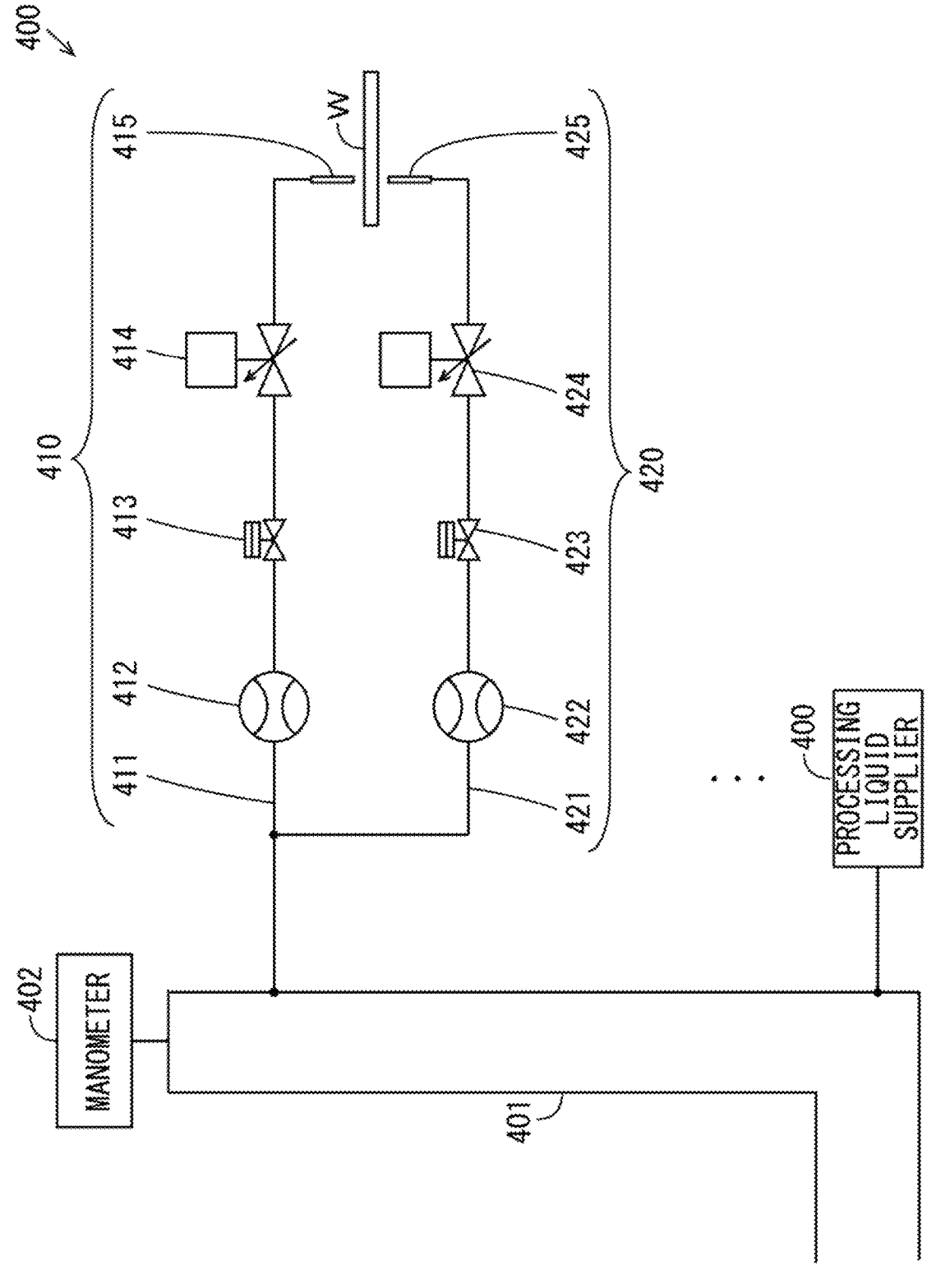
FIG. 2 is a diagram showing the configuration of a processing liquid supplier in the first embodiment.

A substrate processing apparatus, an abnormality detection method and a non-transitory computer readable medium storing an abnormality detection program according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar cell, or the like.

FIG. 1 is a block diagram showing the schematic configuration of the substrate processing apparatus according to one embodiment of the present invention. As shown in FIG. 1, the substrate processing apparatus 1 includes a substrate processor 100 and a controller 200. The substrate processor 100 includes one or a plurality of processing units 110 that performs various processes on a substrate using a processing liquid.

Specifically, each processing unit 110 may be a cleaning unit that supplies a cleaning liquid to a substrate, a coating unit that supplies a coating liquid to a substrate or a developing unit that supplies a developing liquid to a substrate. Each processing unit 110 is provided with a rotation holder that holds and rotates a substrate, a processing liquid supplier that supplies a processing liquid to a substrate or the like.

Further, in a case in which the processing unit 110 is an etching unit that supplies an etching liquid to a substrate, the substrate processor 100 may be provided with a chemical liquid generator 300. The chemical liquid generator 300 generates a diluted chemical liquid obtained by dilution of an undiluted liquid of a chemical liquid as an etching liquid and supplies the etching liquid to each substrate processor 100.

The controller 200 includes a CPU (Central Processing Unit) and a memory, a microcomputer or the like. The CPU of the controller 200 controls the operations of various operation components in the substrate processor 100 or the chemical liquid generator 300. The memory of the controller 200 stores the abnormality detection program for detecting an abnormality of an operation component of the substrate processing apparatus 1.

Further, the CPU of the controller 200 collects predetermined information from various operation components in the substrate processor 100 or the chemical liquid generator 300 during execution of substrate processing and detects an abnormality in the substrate processing apparatus 1 based on a result of processing of the collected information. An example of detection of an abnormality in the substrate processing apparatus 1 relating to various operation components of the substrate processor 100 or the chemical liquid generator 300 will be described below.

<2> First Embodiment

(1) Processing Liquid Supplier

In a first embodiment, an abnormality in a processing liquid supplier included in each processing unit 110 as an operation component of the substrate processor 100 is detected. FIG. 2 is a diagram showing the configuration of a processing liquid supplier in the first embodiment. As shown in FIG. 2, a plurality of processing liquid suppliers 400 are connected to a circulation pipe 401 through which a processing liquid circulates. Further, a manometer 402 for detecting the pressure of the processing liquid is provided in the circulation pipe 401.

A processing liquid supplier 400 includes an upper surface supplier 410 and a lower surface supplier 420. The upper surface supplier 410 includes a pipe 411, a flowmeter 412, an on-off valve 413, a regulating valve 414 and a nozzle 415. The pipe 411 is connected to the circulation pipe 401. Thus, the processing liquid flowing from the circulation pipe 401 flows through the pipe 411. In the pipe 411, the flowmeter 412, the on-off valve 413, the regulating valve 414 and the nozzle 415 are provided in this order from an upstream position to a downstream position.

The flowmeter 412 detects the flow rate of the processing liquid flowing through the pipe 411 and provides a result of detection to the controller 200. The on-off valve 413 opens or closes the flow path of the pipe 411. The regulating valve 414 includes a motor needle valve, for example, and adjusts the flow rate of the processing liquid flowing through the pipe 411 based on the pulse control performed by the controller 200. The nozzle 415 is arranged above a substrate W and supplies the processing liquid to the upper surface of the substrate W.

The lower surface supplier 420 includes a pipe 421, a flowmeter 422, an on-off valve 423, a regulating valve 424 and a nozzle 425. The upstream end of the pipe 421 is connected to the pipe 411 at a position farther upstream than the flowmeter 412. Thus, the processing liquid flowing from the circulation pipe 401 flows through the pipe 421. In the pipe 421, the flowmeter 422, the on-off valve 423, the regulating valve 424 and the nozzle 425 are provided in this order from an upstream position to a downstream position.

The flowmeter 422 detects the flow rate of the processing liquid flowing through the pipe 421 and provides a result of detection to the controller 200. The on-off valve 423 opens or closes the flow path of the pipe 421. The regulating valve 424 includes a motor needle valve, for example, and adjusts the flow rate of the processing liquid flowing through the pipe 421 based on the pulse control performed by the controller 200. The nozzle 425 is arranged below the substrate W and supplies the processing liquid to the lower surface of the substrate W.

In the present example, the nozzles 415, 425 supply the processing liquid to the upper surface and the lower surface of the substrate W to be processed at substantially the same frequency and at substantially the same flow rate. Thus, the upper surface and the lower surface of the substrate W are processed. The substrate W to be processed may be processed while being held and rotated by a rotation holder 700 of FIG. 19, described below, for example.

(2) Controller

Figure 3:
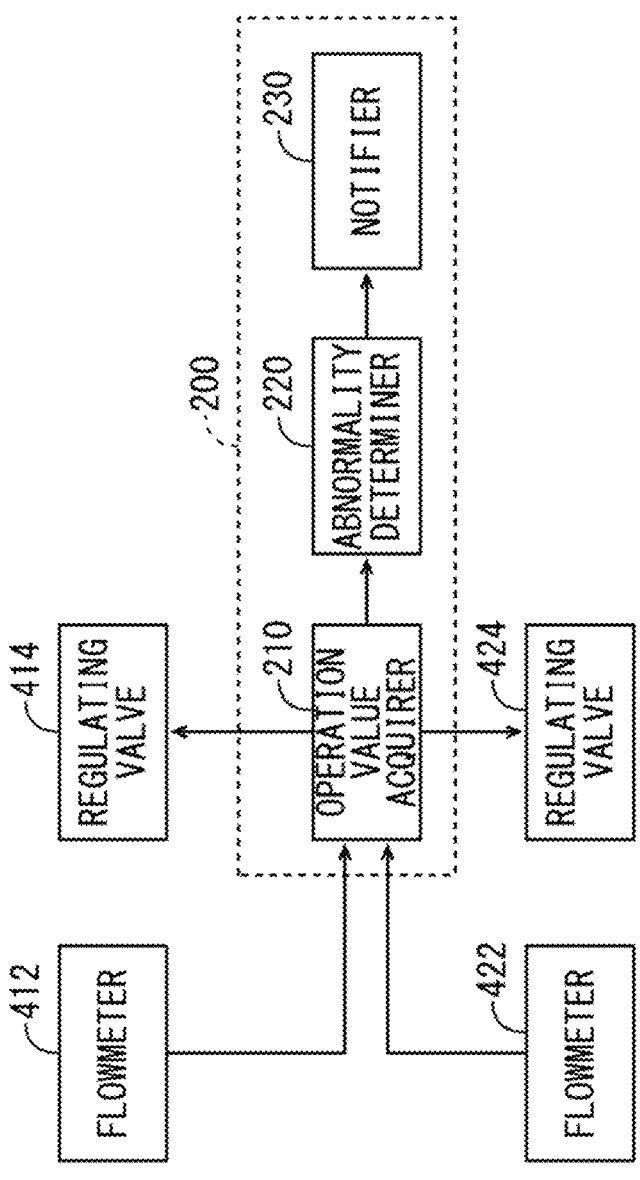
FIG. 3 is the functional block diagram showing the configuration of the controller.

FIG. 3 is the functional block diagram showing the configuration of the controller 200. As shown in FIG. 3, the controller 200 includes an operation value acquirer 210, an abnormality determiner 220 and a notifier 230 as functions. The functions of the controller 200 are implemented by execution of the abnormality detection program stored in the memory by the CPU of the controller 200. Part or all of the functions of the controller 200 may be implemented by hardware such as an electronic circuit.

The operation value acquirer 210 performs the pulse control of the regulating valve 414 by supplying a predetermined number of pulses to the regulating valve 414 such that the flow rate of the processing liquid flowing through the flow path of the upper surface supplier 410 is regulated to a predetermined value based on a result of detection supplied from the flowmeter 412. Thus, the operation value acquirer 210 acquires a pulse value supplied to the regulating valve 414 as a first operation value.

Similarly, the operation value acquirer 210 performs the pulse control of the regulating valve 424 by supplying a predetermined number of pulses to the regulating valve 424 such that the flow rate of the processing liquid flowing through the flow path of the lower surface supplier 420 is regulated to a predetermined value based on a result of detection supplied from the flowmeter 422. Thus, the operation value acquirer 210 acquires a pulse value supplied to the regulating valve 424 as a second operation value.

The flow rate of the processing liquid may not be stable immediately after the start and end of the supply of the processing liquid. As such, a pulse value does not have to be acquired immediately after the start and the end of the supply of the processing liquid. In this case, pulse values are acquired as first and second operation values in a period which is from a predetermined point in time after the start of supply to a predetermined point in time before the end of supply and during which the flow rate of the processing liquid is stabilized.

Each time the pulse control of the regulating valves 414, 424 is performed, the abnormality determiner 220 plots a datapoint determined by a set of a pulse value supplied to the regulating valve 414 and a pulse value supplied to the regulating valve 424 on a correlation graph. FIG. 4 is a diagram showing a correlation graph. As shown in FIG. 4, the correlation graph is a two-dimensional graph having first and second operation values as axes. Specifically, in the correlation graph of FIG. 4, the abscissa indicates a pulse value supplied to the regulating valve 414, and the ordinate indicates a pulse value supplied to the regulating valve 424.

In the correlation graph, an allowable range R is defined in advance based on the correlation between a pulse value supplied to the regulating valve 414 and a pulse value supplied to the regulating valve 424. In the present example, the allowable range R has an elliptical shape, and is defined so as to include a predetermined ratio (95%, for example) of datapoints out of the datapoints defined by sets of a pulse value supplied to the regulating valve 414 and a pulse value supplied to the regulating valve 424 that are acquired in advance before the substrate is processed. The allowable range R may be defined based on a regression curve obtained by distribution of datapoints. The allowable range R is preferably defined based on datapoints acquired before the processing liquid supplier 400 deteriorates over time such as a time when the processing liquid supplier 400 is installed.

The abnormality determiner 220 determines whether an abnormality has occurred based on the ratio of datapoints exceeding the allowable range R to the plotted datapoints at a predetermined point in time. Determination in regard to an abnormality may be made each time a predetermined number of substrates W are processed or each time a predetermined period of time elapses. In this case, an abnormality in the substrate processing apparatus 1 is detected easily at an early stage.

In the present example, in a case in which the ratio of the datapoints exceeding the allowable range R to the plotted datapoints exceeds a predetermined threshold value, it is determined that an abnormality has occurred. In this case, it is assumed that an abnormality has occurred in an operation component relating to the regulating valve 414 or the regulating valve 424. An operation component relating to the regulating valve 414 or the regulating valve 424 may include a needle, a diaphragm, a bearing, a motor coil or the like.

As another example of determination in regard to an abnormality, an allowable range may be updated so as to include a predetermined ratio of plotted datapoints at a point in time at which determination in regard to an abnormality is made. Further, it may be determined that an abnormality has occurred based on the change rate of an updated allowable range with respect to a predetermined allowable range R. The change rate of an allowable range includes the change rate of a major axis of the allowable range, the change rate of a minor axis of the allowable range or the change rate of an area of the allowable range.

In a case in which the abnormality determiner 220 determines that an abnormality has occurred, the notifier 230 notifies a user of an occurrence of the abnormality. As an example of notification made by the notifier 230, in a case in which the substrate processing apparatus 1 includes a display device, a character string indicating that an abnormality has occurred may be displayed. In a case in which the substrate processing apparatus 1 includes a sound output device, a sound indicating the similar content may be output, or a warning sound such as a buzzer may be output. In a case in which the substrate processing apparatus 1 includes an indicator light such as a lamp, the indicator light may be turned on, turned off or blinked in a manner corresponding to the content of warning.

(3) Abnormality Detection Process

Figure 5:
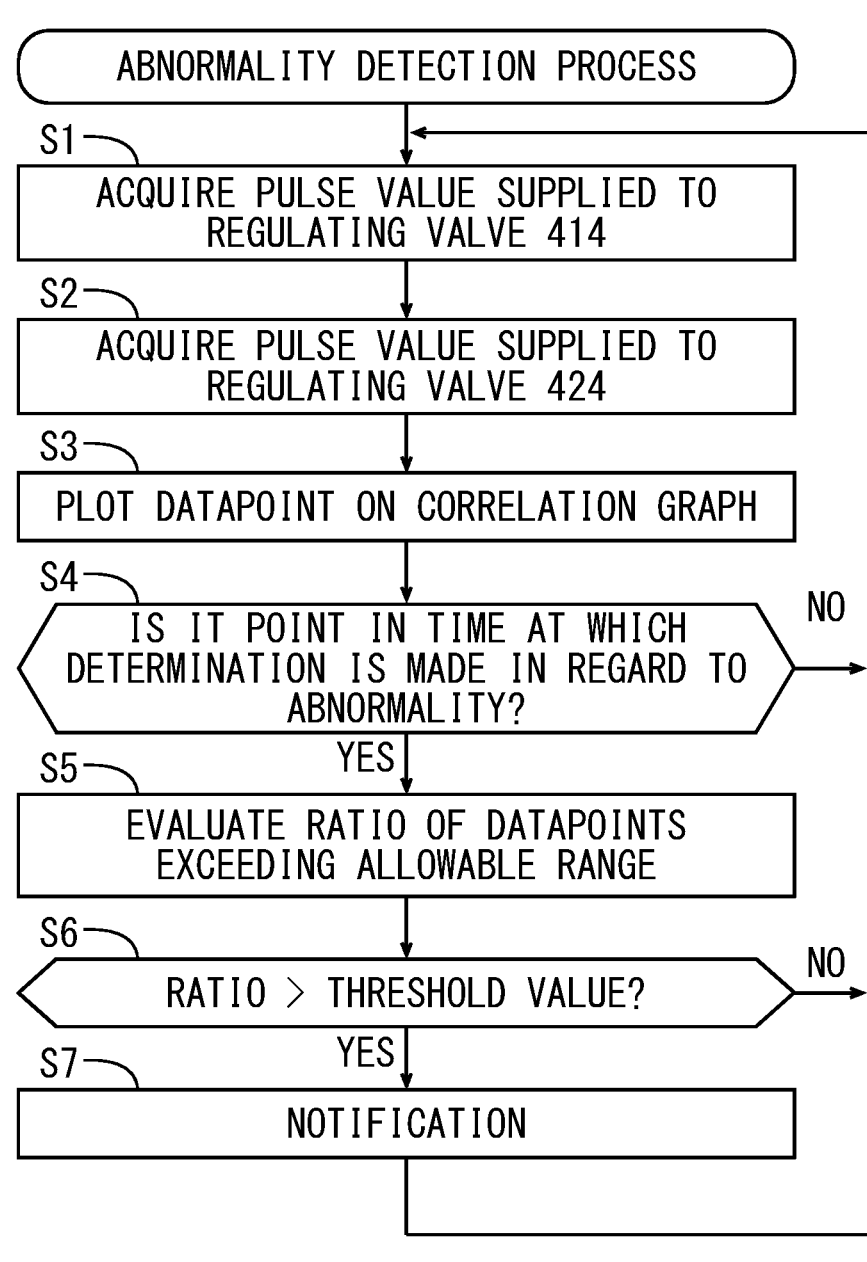
FIG. 5 is a flowchart showing an abnormality detection process performed by the controller of FIG. 3.

FIG. 5 is a flowchart showing an abnormality detection process performed by the controller 200 of FIG. 3. The abnormality detection process of FIG. 5 is performed by execution of the abnormality detection program stored in the memory by the CPU of the controller 200. The abnormality detection process is performed in parallel with a substrate process. The abnormality detection process will be described with reference to the controller 200 of FIG. 3 and the flowchart of FIG. 5.

First, the operation value acquirer 210 acquires a pulse value supplied to the regulating valve 414 (step S1). Further, the operation value acquirer 210 acquires a pulse value supplied to the regulating valve 424 (step S2). The step S1 is performed when the upper surface of the substrate W is processed, and the step S2 is performed when the lower surface of the substrate W is processed. The execution order of the steps S1 and S2 is defined by the recipe of a substrate process. Therefore, either of the steps S1 and S2 may be performed first, or the steps S1 and S2 may be performed at the same time.

Next, the abnormality determiner 220 plots a datapoint defined by a set of pulse values acquired in the steps S1 and S2 on a correlation graph (step S3). Subsequently, the abnormality determiner 220 determines whether a current point in time is a point in time at which determination in regard to an abnormality is to be determined (step S4). Each time a predetermined number of substrates W are processed, it may be determined that a current point in time is a point in time at which determination in regard to an abnormality is to be determined. Alternatively, it may be determined that a current point in time is a point in time at which determination in regard to an abnormality is to be made each time a predetermined period of time elapses. In a case in which a current point in time is not a point in time at which determination in regard to an abnormality is to be made, the abnormality determiner 220 returns to the step S1. The steps S1 to S4 are repeated until a current point in time is a point in time at which determination in regard to an abnormality is to be made.

In a case in which a current point in time is a point in time at which determination in regard to an abnormality is to be made, the abnormality determiner 220 evaluates the ratio of datapoints exceeding the allowable range R to the datapoints plotted on the correlation graph (step S5). Thereafter, the abnormality determiner 220 determines whether the ratio evaluated in the step S5 exceeds a predetermined threshold value (step S6). In a case in which the ratio is equal to or smaller than the threshold value, the abnormality determiner 220 does not determine that an abnormality has occurred and returns to the step S1. In a case in which the ratio exceeds the threshold value, the abnormality determiner 220 determines that an abnormality has occurred. In this case, the notifier 230 makes notification of an occurrence of an abnormality (step S7) and returns to the step S1.

When the process of all of substrates W to be processed by the substrate processing apparatus 1 ends, it may be determined in the step S4 that a current point in time is a point in time at which determination in regard to an abnormality is to be made. With this configuration, in a case in which the ratio is equal to or smaller than a threshold value in the step S6, the abnormality detection process ends. Alternatively, after the notification is made in the step S7, the abnormality detection process ends.

(4) Effects

In the substrate processing apparatus 1 according to the present embodiment, pulse values supplied to the regulating valves 414, 424 are respectively acquired by the operation value acquirer 210 as the first and second operation values. The abnormality determiner 220 determines whether an abnormality has occurred based on the correlation between a pulse value supplied to the regulating valve 414 and a pulse value supplied to the regulating valve 424, the pulse values being acquired by the operation value acquirer 210. In this case, it is possible to detect an abnormality in the substrate processing apparatus 1 at an early stage based on the correlation between a pulse value supplied to the regulating valve 414 and a pulse value supplied to the regulating valve 424.

Whether an abnormality has occurred is determined based on the ratio of datapoints exceeding the allowable range R to the datapoints defined by sets of a pulse value supplied to the regulating valve 414 and a pulse value supplied to the regulating valve 424, the pulse values being acquired by the operation value acquirer 210. In this case, it is possible to detect an abnormality in the substrate processing apparatus 1 in a simple process.

Further, the allowable range R is defined so as to include a predetermined ratio of datapoints to the datapoints defined by sets of a pulse value supplied to the regulating valve 414 and a pulse value supplied to the regulating valve 424, the pulse values being acquired in advance by the operation value acquirer 210 before a substrate is processed. Therefore, the allowable range R to be used for determination in regard to an abnormality can be defined easily.

(5) Modified Example

While a pulse value supplied to the regulating valve 414 is acquired as a first operation value and a pulse value supplied to the regulating valve 424 is acquired as a second operation value in the present embodiment, the embodiment is not limited to this. The pressure of the processing liquid flowing through the circulation pipe 401 detected by the manometer 402 is supplied to the operation value acquirer 210. As such, a pulse value supplied to the regulating valve 414 may be acquired as a first operation value, and the pressure of the processing liquid flowing through the circulation pipe 401 may be acquired as a second operation value.

FIG. 6 is a diagram showing a correlation graph. In the correlation graph of FIG. 6, the abscissa indicates a pulse value supplied to the regulating valve 414, and the ordinate indicates the pressure of the processing liquid. As shown in FIG. 6, each time the pulse control of the regulating valve 414 is performed, a datapoint defined by a set of a pulse value supplied to the regulating valve 414 and a pressure of the processing liquid is plotted on the correlation graph. Whether an abnormality has occurred is determined based on the ratio of datapoints exceeding the allowable range R to the plotted datapoints.

With this configuration, in a case in which it is determined that an abnormality has occurred, it is assumed that an abnormality has occurred in an operation component relating to the regulating valve 414 or the circulation pipe 401. In the modified example, a pulse value supplied to the regulating valve 424 may be acquired as a first operation value. With this configuration, in a case in which it is determined that an abnormality has occurred, it is assumed that an abnormality has occurred in an operation component relating to the regulating valve 424 or the circulation pipe 401.

<3> Second Embodiment

(1) Chemical Liquid Generator

In a second embodiment, an abnormality in the chemical liquid generator 300 is detected. FIG. 7 is a diagram showing the configuration of the chemical liquid generator 300 in the second embodiment. As shown in FIG. 7, the chemical liquid generator 300 includes an undiluted liquid supplier 310, a dilution liquid supplier 320, a mixing pipe 330, a gas supplier 340, a mixing tank 350 and a supply pipe 360.

The undiluted liquid supplier 310 includes a pipe 311, an on-off valve 312, a flowmeter 313 and a regulating valve 314. The upstream end of the pipe 311 is connected to an undiluted liquid supply source 301 that supplies an undiluted liquid of a chemical liquid. As a result, the undiluted liquid flowing from the undiluted liquid supply source 301 flows through the pipe 311. In the present example, the undiluted liquid is hydrofluoric acid.

In the pipe 311, the on-off valve 312, the flowmeter 313 and the regulating valve 314 are provided in this order from an upstream position to a downstream position. The on-off valve 312 opens or closes the flow path of the pipe 311. The flowmeter 313 detects the flow rate of the undiluted liquid flowing through the pipe 311 and supplies a result of detection to the controller 200. The regulating valve 314 includes a motor needle valve, for example, and regulates the flow rate of the undiluted liquid flowing through the pipe 311 based on the pulse control performed by the controller 200.

The dilution liquid supplier 320 includes a pipe 321, an on-off valve 322, a flowmeter 323 and a regulating valve 324. The upstream end of the pipe 321 is connected to a dilution liquid supply source 302 that supplies the dilution liquid. Thus, a dilution liquid flowing from the dilution liquid supply source 302 flows through the pipe 321. In the present example, the dilution liquid is DIW (De-ionized water).

In the pipe 321, the on-off valve 322, the flowmeter 323 and the regulating valve 324 are provided in this order from an upstream position to a downstream position. The on-off valve 322 opens or closes the flow path of the pipe 321. The flowmeter 323 detects the flow rate of the dilution liquid flowing through the pipe 321 and supplies a result of detection to the controller 200. The regulating valve 324 includes an electric pressure regulator, for example, and regulates the flow rate of the dilution liquid flowing through the pipe 321 based on pulse control performed by the controller 200.

The mixing pipe 330 has one main pipe 331 and two branch pipes 332, 333. The upstream end of the main pipe 331 is connected to the downstream end of the pipe 311 of the undiluted liquid supplier 310 and the downstream end of the pipe 321 of the dilution liquid supplier 320. The branch pipe 332 is connected between the downstream end of the main pipe 331 and the mixing tank 350. The branch pipe 333 is connected between the downstream end of the main pipe 331 and a waste liquid tank 303. On-off valves 334, 335 are respectively provided in the branch pipes 332, 333.

In the main pipe 331, the undiluted liquid supplied from the undiluted liquid supplier 310 and the dilution liquid supplied from the dilution liquid supplier 320 are mixed, so that a diluted chemical liquid is generated. In the present example, the diluted chemical liquid is dilute hydrofluoric acid. The diluted chemical liquid generated in the main pipe 331 is supplied to the mixing tank 350 through the branch pipe 332.

The gas supplier 340 includes a pipe 341 and an on-off valve 342. The upstream end of the pipe 341 is connected to a gas supply source 304 that supplies gas. Thus, gas supplied from the gas supply source 304 flows through the pipe 341. In the present example, gas is an inert gas such as nitrogen. The downstream end of the pipe 341 is connected to the mixing tank 350. The on-off valve 342 is provided in the pipe 341 and opens or closes the flow path of the pipe 341.

The mixing tank 350 stores a liquid mixture of the undiluted liquid and the dilution liquid as the diluted chemical liquid. The mixing tank 350 is provided with four liquid level sensors 351, 352, 353, 354. The liquid level sensors 351 to 354 respectively detect first to fourth liquid levels of the diluted chemical liquid stored in the mixing tank 350 and provide results of detection to the controller 200.

The first, second, third and fourth liquid levels are located in this order from below toward above. Specifically, the first liquid level is slightly higher than the bottom surface of the mixing tank 350. The second liquid level is higher than the first liquid level by a predetermined height. The third liquid level is lower than the fourth liquid level by a predetermined height. The fourth liquid level is slightly lower than the upper surface of the mixing tank 350.

The supply pipe 360 has one main pipe 361 and two branch pipes 362, 363. The upstream end of the main pipe 361 is connected to the mixing tank 350. The branch pipe 362 is a circulation pipe used for circulation of the diluted chemical liquid and is connected between the downstream end of the main pipe 361 and the mixing tank 350. The branch pipe 363 is a processing pipe used for processing of the substrate W and is connected between the downstream end of the main pipe 361 and the substrate processor 100.

A concentration meter 364 and a heater 365 are provided in the main pipe 361. A pump 366, a filter 367 and an on-off valve 368 are provided in the branch pipe 362. An on-off valve 369 is provided in the branch pipe 363. The concentration meter 364 measures the concentration of the diluted chemical liquid flowing through the main pipe 361 and supplies a result of measurement to the controller 200.

The pump 366 is driven, and the on-off valve 368 is opened, so that the diluted chemical liquid flowing from the mixing tank 350 is heated by the heater 365 and circulates back to the mixing tank 350 through the filter 367. In the present example, the diluted chemical liquid stored in the mixing tank 350 constantly circulates through the branch pipe 362.

Further, the on-off valve 342 and the on-off valve 369 are opened, so that the diluted chemical liquid stored in the mixing tank 350 is pressurized by gas. Thus, the diluted chemical liquid stored in the mixing tank 350 is guided downstream through the main pipe 361, heated by the heater 365 and then supplied to the substrate processor 100 through the branch pipe 363.

As indicated by the one-dot and dash lines in FIG. 7, the chemical liquid generator 300 may further include a circulation pipe 370 similar to the circulation pipe 401 of FIG. 2. In this case, the substrate processor 100 and the mixing tank 350 are connected to each other by the circulation pipe 370. In the substrate processor 100, part of the diluted chemical liquid supplied from the mixing tank 350 is used for a substrate process such as cleaning. The volume of a diluted chemical solution to be used is defined by the recipe of a substrate process. Another part of the diluted chemical liquid supplied to the substrate processor 100 is returned to the mixing tank 350 through the circulation pipe 370 without being used for a substrate process.

(2) Controller

Since the configuration of a controller 200 in the present embodiment is basically similar to the configuration of the controller 200 of FIG. 3 in the first embodiment, the operation of the controller 200 will be briefly described with reference to FIG. 3. The same also applies to the controller 200 in third to seventh embodiments, described below.

In the substrate processor 100, the diluted chemical liquid supplied from the chemical liquid generator 300 is used, so that the liquid level of the diluted chemical liquid stored in the mixing tank 350 is lowered. As such, in a case in which a second liquid level is detected by the liquid level sensor 352, replenishment of the diluted chemical liquid is started.

Specifically, the operation value acquirer 210 of FIG. 3 opens the on-off valves 312, 322. Further, the operation value acquirer 210 performs the pulse control of the regulating valve 314 such that the undiluted liquid is supplied at a constant flow rate from the undiluted liquid supplier 310. Similarly, the operation value acquirer 210 performs the pulse control of the regulating valve 324 such that the dilution liquid is supplied at a constant flow rate from the dilution liquid supplier 320. Thus, the undiluted liquid and the dilution liquid are respectively supplied at constant flow rates from the undiluted liquid supplier 310 and the dilution liquid supplier 320.

The supplied undiluted liquid and the supplied dilution liquid are mixed in the main pipe 331 of the mixing pipe 330, so that the diluted chemical liquid is generated. The operation value acquirer 210 calculates a theoretical value of concentration of the diluted chemical liquid to be generated based on the ratio between the flow rate of the undiluted liquid and the flow rate of the dilution liquid that are respectively detected by the flowmeters 313, 323, and acquires the calculated theoretical value of concentration as a first operation value.

The generated diluted chemical liquid is stored in the mixing tank 350 through the branch pipe 332, so that the liquid level of the diluted chemical liquid stored in the mixing tank 350 rises. In a case in which a third liquid level is detected by the liquid level sensor 353, the operation value acquirer 210 closes the on-off valves 312, 322. Thus, replenishment of the diluted chemical liquid is stopped. The operation value acquirer 210 acquires an actual measured value of concentration of the diluted chemical liquid after replenishment detected by the concentration meter 364 as a second operation value.

Since the flow rate of the dilution liquid or the undiluted liquid is not stable immediately after the start and end of generation of the diluted chemical liquid, the concentration of the generated diluted chemical liquid may be unstable. As such, immediately after the start of generation of the diluted chemical liquid, the on-off valve 335 is opened and the on-off valve 334 is closed for a predetermined period of time. Thus, the diluted chemical liquid having an unstable concentration is discarded into the waste liquid tank 303. Further, also immediately after the end of generation of the diluted chemical liquid, the on-off valve 335 is opened and the on-off valve 334 is closed for a predetermined period of time. Thus, the diluted chemical liquid having an unstable concentration is discarded into the waste liquid tank 303. Thus, the diluted chemical liquid having a stable concentration is stored in the mixing tank 350.

FIG. 8 is a diagram showing a correlation graph. In the correlation graph of FIG. 8, the abscissa indicates a theoretical value of concentration, and the ordinate indicates an actual measured value of concentration. As shown in FIG. 8, each time the diluted chemical liquid is replenished, the abnormality determiner 220 plots a datapoint defined by a set of a theoretical value and an actual measured value of concentration of a replenished diluted chemical liquid on the correlation graph. Further, the abnormality determiner 220 determines whether an abnormality has occurred based on the ratio of datapoints exceeding an allowable range R to the plotted datapoints. In a case in which it is determined that an abnormality has occurred, it is presumed that an abnormality has occurred in an operation component relating to the regulating valves 314, 324 or the concentration meter 364.

In a case in which the abnormality determiner 220 determines that an abnormality has occurred, the notifier 230 notifies a user of an occurrence of the abnormality. In the present embodiment, in a case in which a first liquid level is detected by the liquid level sensor 351 or a case in which a fourth liquid level is detected by the liquid level sensor 354, the control of the chemical liquid generator 300 is stopped. Also in this case, the notifier 230 may notify a user that control of the chemical liquid generator 300 has been stopped.

The abnormality detection process in the present example is similar to the abnormality detection process of FIG. 5 except that a theoretical value and an actual measured value of concentration of the diluted chemical liquid are respectively acquired in the steps S1 and S2. The step S1 is performed in a period during which the diluted chemical liquid is replenished, for example. The step S2 is performed after replenishment of the diluted chemical liquid is stopped, for example.

(3) Effects

In the substrate processing apparatus 1 according to the present embodiment, a theoretical value of concentration of the diluted chemical liquid calculated based on the ratio between the flow rate of the undiluted liquid and the flow rate of the dilution liquid that are respectively detected by the flowmeters 313, 323 is acquired by the operation value acquirer 210 as a first operation value. Further, an actual measured value of concentration of the diluted chemical liquid detected by the concentration meter 364 is acquired by the operation value acquirer 210 as a second operation value.

The abnormality determiner 220 determines whether an abnormality has occurred based on the correlation between a theoretical value of concentration of the diluted chemical liquid and an actual measured value of concentration of the diluted chemical liquid that are acquired by the operation value acquirer 210. In this case, it is possible to detect an abnormality in the substrate processing apparatus 1 at an early stage based on the correlation between a theoretical value of concentration of the diluted chemical liquid and an actual measured value of concentration of the diluted chemical liquid.

In the present embodiment, the abnormality determiner 220 may determine whether an abnormality has occurred using the Hotelling method, a cumulative sum or the like based on the difference between a first operation value and a second operation value. The same applies to the following third to fifth embodiments.

<4> Third Embodiment (1) Operation Value

In the second embodiment, a theoretical value of concentration of the diluted chemical liquid is calculated as a first operation value based on the ratio between an instantaneous value of the flow rate of the undiluted liquid detected by the flowmeter 313 and an instantaneous value of the flow rate of the dilution liquid detected by the flowmeter 323. Further, an instantaneous value of concentration of the diluted chemical liquid is detected by the concentration meter 364 as a second operation value. However, the embodiment is not limited to this. As for operation values in a third embodiment, differences from the operation values in the second embodiment will be described below with suitable reference to the chemical liquid generator 300 of FIG. 7.

FIG. 9 is a diagram for explaining an operation value in the third embodiment. In FIG. 9, the time series of the flow rate of the undiluted liquid, the flow rate of the dilution liquid and the concentration of the diluted chemical liquid respectively detected by the flowmeter 313, the flowmeter 323 and the concentration meter 364 are shown. As shown in FIG. 9, at a point T1 in time at which a predetermined period of time has elapsed from the time when the on-off valves 312, 322 are opened, the undiluted liquid and the dilution liquid are mixed in the mixing pipe 330. Thus, generation of the diluted chemical liquid is started.

As described above, the flow rates of the undiluted liquid and the dilution liquid are not stable immediately after the start of generation of the diluted chemical liquid. As such, in a period from the point T1 in time to a point T2 in time at which a predetermined period of time has elapsed from the point T1 in time, the on-off valve 335 is opened, and the on-off valve 334 is closed. Therefore, the generated diluted chemical liquid is discarded to the waste liquid tank 303. At the point T2 in time, the on-off valve 335 is closed, and the on-off valve 334 is opened. Thus, the supply of the diluted chemical liquid to the mixing tank 350 is started.

At a point T4 at which a predetermined period of time ΔT1 has elapsed from the point T2 in time, the on-off valve 335 is opened, and the on-off valve 334 is closed. Thus, the supply of the diluted chemical liquid to the mixing tank 350 ends. The operation value acquirer 210 of the controller 200 of FIG. 3 calculates a theoretical value of concentration of the diluted chemical liquid to be generated based on an integrated value of the flow rates of the undiluted liquid detected by the flowmeter 313 and an integrated value of the flow rates of the dilution liquid detected by the flowmeter 323 in the period from the point T2 to the point T4 in time. Further, the operation value acquirer 210 acquires the calculated theoretical value of concentration of the diluted chemical liquid as a first operation value.

At a point T3 in time at which a period ΔT2 of time smaller than the period ΔT1 of time has elapsed from the point T2 in time, the diluted chemical liquid the supply of which to the mixing tank 350 is started at the point T2 arrives at the concentration meter 364. At a point T5 in time at which the period ΔT1 of time has elapsed from the point T3 in time, that is, the point T5 in time at which the period ΔT2 of time has elapsed from a point T4 in time, the diluted chemical liquid the supply of which to the mixing tank 350 ends at the point T4 in time arrives at the concentration meter 364. In the period from the point T3 to the point T5 in time, the operation value acquirer 210 calculates a statistical value of concentrations of the diluted chemical liquid detected by the concentration meter 364. Further, the operation value acquirer 210 acquires the calculated statistical value of concentration of the diluted chemical liquid as a second operation value.

In the present embodiment, the above-mentioned statistical value is a mean value and is specifically a value obtained when the sum of concentrations detected at respective points in time in the period from the point T3 to the point T5 in time is divided by the number of times concentrations are detected. A statistical value may be another calculation value such as a weighted average value. Further, the period ΔT2 of time may be determined by measurement or may be determined by calculation based on the length of a flow path, the cross-sectional area of a flow path and the flow rate of the diluted chemical liquid.

The abnormality detection process in the present embodiment is similar to the abnormality detection process of FIG. 5 except that a theoretical value and a statistical value of concentration of the diluted chemical liquid are respectively acquired in the steps S1 and S2. The steps S1 and S2 are performed in a period during which the diluted chemical liquid is replenished, for example. Although the step S1 can be performed at a point in time earlier than a point in time at which the step S2 is performed by the period ΔT2 of time, the step S2 may be started before the step S1 ends.

(2) Effects

In the present embodiment, the abnormality determiner 220 of the controller 200 determines whether an abnormality has occurred based on the correlation between a theoretical value of concentration of the diluted chemical liquid and a statistical value of concentration of the diluted chemical liquid. Here, the correlation between a theoretical value of concentration of the diluted chemical liquid and a statistical value of concentration of the diluted chemical liquid that is acquired in the present embodiment is stronger than the correlation between a theoretical value of concentration of the diluted chemical liquid and an actual measured value of concentration of the diluted chemical liquid acquired in the second embodiment. Therefore, it is possible to detect an abnormality in the substrate processing apparatus 1 more reliably.

<5> Fourth Embodiment

(1) Operation Value

As for operation values in a fourth embodiment, differences from the operation values in the second embodiment will be described below with suitable reference to the chemical liquid generator 300 of FIG. 7. In the present embodiment, a concentration predictive model for predicting the concentration of the diluted chemical liquid is constructed in advance. The constructed concentration predictive model is stored in the memory or the like of the controller 200 in FIG. 1.

When the concentration predictive model is constructed, the control similar to the control performed during the substrate process is performed on each component of the chemical liquid generator 300. A concentration predictive model is preferably constructed before the chemical liquid generator 300 deteriorates over time such as the time when the chemical liquid generator 300 is installed. FIG. 10 is a diagram for explaining one example of the procedure for constructing a concentration predictive model. In FIG. 10, the time series of the flow rate of the undiluted liquid, the flow rate of the dilution liquid, a discharge amount of the diluted chemical liquid to the substrate W in the substrate processor 100 and the concentration of the diluted chemical liquid are shown.

As shown in FIG. 10, when a concentration predictive model is constructed, the flow rate of the undiluted liquid, the flow rate of the dilution liquid, the discharge amount of a diluted chemical liquid and the concentration of the diluted chemical liquid at a plurality of points in time are sequentially detected. The flow rate of the undiluted liquid, the flow rate of the dilution liquid and the concentration of the diluted chemical liquid are respectively detected by the flowmeter 313, the flowmeter 323 and the concentration meter 364. The discharge amount of the diluted chemical liquid may be detected by a flowmeter (not shown) or may be detected by calculation based on the capacity of a flow path, a discharge period of time and the like.

A dataset including the flow rate of the undiluted liquid, the flow rate of the dilution liquid, the discharge amount of the diluted chemical liquid and the concentration of a diluted chemical liquid that are detected in a period from each point in time to a point in time earlier than the point in time by a predetermined period $\Delta T11$ of time is acquired as an explanatory variable corresponding to each point in time. Further, the concentration of the diluted chemical liquid detected at a point in time later than each point in time by a predetermined period $\Delta T12$ of time is acquired as an objective variable corresponding to each point in time. Based on an acquired explanatory variable and an acquired objective variable corresponding to each point in time, training data representing the relationship between the explanatory variable and the objective variable corresponding to the point in time is generated.

In the example of FIG. 10, a dataset detected between a point T11 in time and a point T12 in time at which the period $\Delta T11$ of time has elapsed from the point T11 in time is an explanatory variable corresponding to the point T12 in time. Further, the concentration of the diluted chemical liquid detected at a point T13 in time at which a period $\Delta T12$ of time has elapsed from the point T12 in time is an objective variable corresponding to the point T12 in time. Also in regard to a point in time later than the point T12 in time, an explanatory variable and an objective variable are sequentially acquired, so that a plurality of training data pieces are generated.

A LightGBM (Gradient Boosting Machine) is prepared in advance as a machine learning model. A concentration predictive model is constructed when the LightGBM learns the plurality of generated training data pieces. While the machine learning model is the LightGBM in the present embodiment, the embodiment is not limited to this. The machine learning model may be linear regression, Lasso regression, LSTM (Long Short Term Memory) or the like.

During the substrate process, the flow rate of the undiluted liquid, the flow rate of the dilution liquid, a discharge amount of the diluted chemical liquid and the concentration of a diluted chemical liquid at a plurality of points in time are detected by the flowmeters 313, 323, the concentration meter 364 or the like. The operation value acquirer 210 of the controller 200 in FIG. 3 acquires the flow rate of the undiluted liquid, the flow rate of the dilution liquid, the discharge amount of the diluted chemical liquid and the concentration of the diluted chemical liquid that are detected between each point in time and a point in time that is earlier than the point in time by the period $\Delta T11$ of time as a dataset corresponding to each point in time.

Here, the operation value acquirer 210 predicts the concentration of the diluted chemical liquid at a point in time later than each point in time by the period $\Delta T12$ of time based on the acquired dataset corresponding to each point in time and a concentration predictive model that is constructed in advance. The operation value acquirer 210 acquires a predicted value of concentration of the diluted chemical liquid as a first operation value. Further, the operation value acquirer 210 acquires an actual measured value of concentration of the diluted chemical liquid that is detected at a point in time later than each point in time by the period $\Delta T12$ of time as a second operation value. In this case, a correlation graph in which the abscissa indicates a predicted value of concentration and the ordinate indicates an actual measured value of concentration is created.

An abnormality detection process in the present example is similar to the abnormality detection process of FIG. 5 except that a predicted value and an actual measured value of concentration of the diluted chemical liquid are respectively acquired in the steps S1 and S2. The steps S1 and S2 are performed in a period during which the diluted chemical liquid is replenished, for example.

(2) Effects

In the present embodiment, the abnormality determiner 220 determines whether an abnormality has occurred based on the correlation between a predicted value of concentration of the diluted chemical liquid and an actual measured value of concentration of the diluted chemical liquid. Here, the correlation between a predicted value of concentration of the diluted chemical liquid and an actual measured value of concentration of the diluted chemical liquid that are acquired in the present embodiment is stronger than the correlation between a theoretical value of concentration of the diluted chemical liquid and an actual measured value of concentration of the diluted chemical liquid that are acquired in the second embodiment. Therefore, it is possible to detect a single abnormality that occurs in the substrate processing apparatus 1 in a relatively short period of time more reliably.

While the explanatory variables of the training data include the flow rate of the undiluted liquid, the flow rate of the dilution liquid, the discharge amount of the diluted chemical liquid and the concentration of the diluted chemical liquid in the present embodiment, the embodiment is not limited to this. In a case in which contribution of the discharge amount of the diluted chemical liquid to an objective variable is relatively small, the explanatory variables of training data do not have to include the discharge amount of the diluted chemical liquid. On the other hand, the explanatory variables of the training data may include a feature amount other than the flow rate of the undiluted liquid, the flow rate of the dilution liquid, the discharge amount of the diluted chemical liquid and the concentration of the diluted chemical liquid. In this case, the concentration of a diluted chemical liquid can be predicted more accurately.

(3) Reference Example

In the present embodiment, the flow rates of the undiluted liquid and the dilution liquid are respectively controlled to be constant by the regulating valves 314, 324. Further, the dilution liquid and the undiluted liquid present in a period during which the flow rate is not stable are discarded to the waste liquid tank 303 without being supplied to the mixing tank 350. With this configuration, because contribution of the flow rates of the undiluted liquid and the dilution liquid to an objective variable is relatively small, explanatory variables of training data do not have to include the flow rate of the undiluted liquid or the dilution liquid. Even in this case, it is possible to acquire a predicted value of concentration of the diluted chemical liquid having the strong correlation with an actually measured value of concentration of the diluted chemical liquid.

<6> Fifth Embodiment

(1) Operation Value

As for operation values in a fifth embodiment, differences from the operation values in the third embodiment will be described below with suitable reference to the chemical liquid generator 300 of FIG. 7 and FIG. 11, described below.

FIG. 11 is a partially enlarged view of the chemical liquid generator 300 of FIG. 7. As shown in FIG. 11, at a point t in time at which the diluted chemical liquid is replenished, a volume $W_1^{(t)}$ of the diluted chemical liquid flows into the mixing tank 350 through the mixing pipe 330 per unit time. In the present example, the unit time is a period 11 in which flow rates are detected by the flowmeters 313, 323. Therefore, the volume $W_1^{(t)}$ is the volume of the diluted chemical liquid flowing into the mixing tank 350 between the point t in time and a point in time earlier than the point t in time by the period 11, and is calculated based on the flow rates of the undiluted liquid and the dilution liquid that are respectively detected by the flowmeters 313, 323. A concentration $C_0^{(t)}$ of an inflowing dilution liquid is calculated based on the flow rates of the undiluted liquid and the dilution liquid, and the specific gravity of the undiluted liquid.

Further, a volume $W_2$ of the diluted chemical liquid flows out from the mixing tank 350 through the supply pipe 360 per unit time. The volume $W_2$ is a known constant value that is independent of time and is defined by an operating parameter of the pump 366.

Further, at the point t in time, a volume $W_3^{(t)}$ of the diluted chemical liquid flows into the mixing tank 350 through the circulation pipe 370 per unit time. Here, the diluted chemical liquid that has passed through the substrate processor 100 arrives at the mixing tank 350 after a predetermined period $\tau 0$ of time has elapsed. Therefore, the volume $W_3^{(t)}$ is calculated by subtraction of the volume of the diluted chemical liquid used in the substrate processor 100 at a point $(t-\tau 0)$ in time that is earlier than the point t in time by the period $\tau 0$ of time from the volume $W_2$. Further, the period $\tau 0$ of time may be determined by measurement or may be determined by calculation based on the length of a flow path, the cross-sectional area of a flow path and the flow rate of the diluted chemical liquid.

Due to these inflow and outflow of the diluted chemical liquid, a volume $W^{(t)}$ of a diluted chemical liquid is stored in the mixing tank 350 at the point t in time. An update formula of the volume $W^{(t)}$ at the point t in time and the update formula of the concentration $C^{(t)}$ of the diluted chemical liquid stored in the mixing tank 350 are calculated with use of the following formulas (1) and (2).

$$W^{(t)} = W^{(t-r1)} + W_1^{(t)} + W_3^{(t)} - W_2 \qquad (1)$$

$$C^{(t)} = \frac{C^{(t-r1)} \cdot \left( W^{(t-r1)} - W_2 \right) + C^{(t-r2)} \cdot W_3^{(t)} + C_0^{(t)} \cdot W_1^{(t)}}{W^{(t)}} \qquad (2)$$

In the formula (2), 12 is a period until the diluted chemical liquid that has flowed out from the mixing tank 350 through the supply pipe 360 flows into the mixing tank 350 through the circulation pipe 370. The period 12 may be determined by measurement or may be determined by calculation based on the length of a flow path, the cross-sectional area of a flow path and the flow rate of the diluted chemical liquid. A volume $W^{(t-\tau 1)}$ and the concentrations $C^{(t-\tau 1)}$ and $C^{(t-\tau 2)}$ as initial values may be appropriately determined so as to match actual measured values.

The operation value acquirer 210 of the controller 200 of FIG. 3 calculates a concentration $C^{(t)}$ of the diluted chemical liquid stored in the mixing tank 350 at each point t in time based on the formula (2). The operation value acquirer 210 acquires a calculated theoretical value of concentration $C^{(t)}$ of the diluted chemical liquid as a first operation value. Further, the operation value acquirer 210 acquires an actual measured value of concentration (that is, a concentration $C^{(t+\Delta T2)}$ detected by the concentration meter 364 at a point in time at which the period $\Delta T2$ of time of FIG. 9 has elapsed from each point t in time. The period $\Delta T2$ of time is a period of time until the diluted chemical liquid flowing out from the mixing tank 350 arrives at the concentration meter 364. In this case, the correlation graph in which the abscissa indicates a theoretical value of concentration and the ordinate indicates a measured value of concentration is created.

An abnormality detection process in the present example is similar to the abnormality detection process of FIG. 5 except that a predicted value and an actual measured value of concentration of the diluted chemical liquid are respectively acquired in the steps S1 and S2. The steps S1 and S2 may be performed in a period during which the diluted chemical liquid is replenished, for example. On the other hand, the steps S1 and S2 may be performed in a period during which the diluted chemical liquid is not replenished. In this case, $W_1^{(t)}$ and the concentration $C_0^{(t)}$ may be set to 0 at a point in time other than the point in time at which the diluted chemical solution is replenished.

(2) Effects

In the present embodiment, the abnormality determiner 220 of the controller 200 determines whether an abnormality has occurred based on the correlation between a theoretical value of concentration of the diluted chemical liquid and an actual measured value of concentration of the diluted chemical liquid stored in the mixing tank 350. Here, in a case in which the concentration of the diluted chemical liquid supplied to the substrate processor 100 changes, an unused diluted chemical liquid in the substrate processor 100 is returned to the mixing tank 350. Thus, the concentration of the diluted chemical liquid stored in the mixing tank 350 changes.

Even in this case, with the present embodiment, because a theoretical value of concentration of the diluted chemical liquid stored in the mixing tank 350 is calculated based on the volume of the diluted chemical liquid flowing into or out of the mixing tank 350, the flow rate of the undiluted liquid and the flow rate of the dilution liquid, it is possible to strengthen the correlation between a theoretical value of concentration of the diluted chemical liquid and a statistical value of concentration of the diluted chemical liquid. Therefore, it is possible to detect an abnormality in the substrate processing apparatus 1 more reliably.

There may be a certain amount of deviation between a theoretical value of concentration of the diluted chemical liquid calculated based on the formula (2) and an actual measured value of concentration of the diluted chemical liquid detected by the concentration meter 364. As such, an appropriately defined offset value may be added to the concentration $C_0^{(t)}$ of the dilution liquid flowing into the mixing tank 350 so as to cancel the deviation. In this case, even in a period immediately after the start of calculation of concentration of the diluted chemical liquid, the correlation between a theoretical value of concentration of the diluted chemical liquid and an actual measured value of concentration of the diluted chemical liquid can be strengthened.

<7> Sixth Embodiment

(1) Rotation Holder

Figure 12:
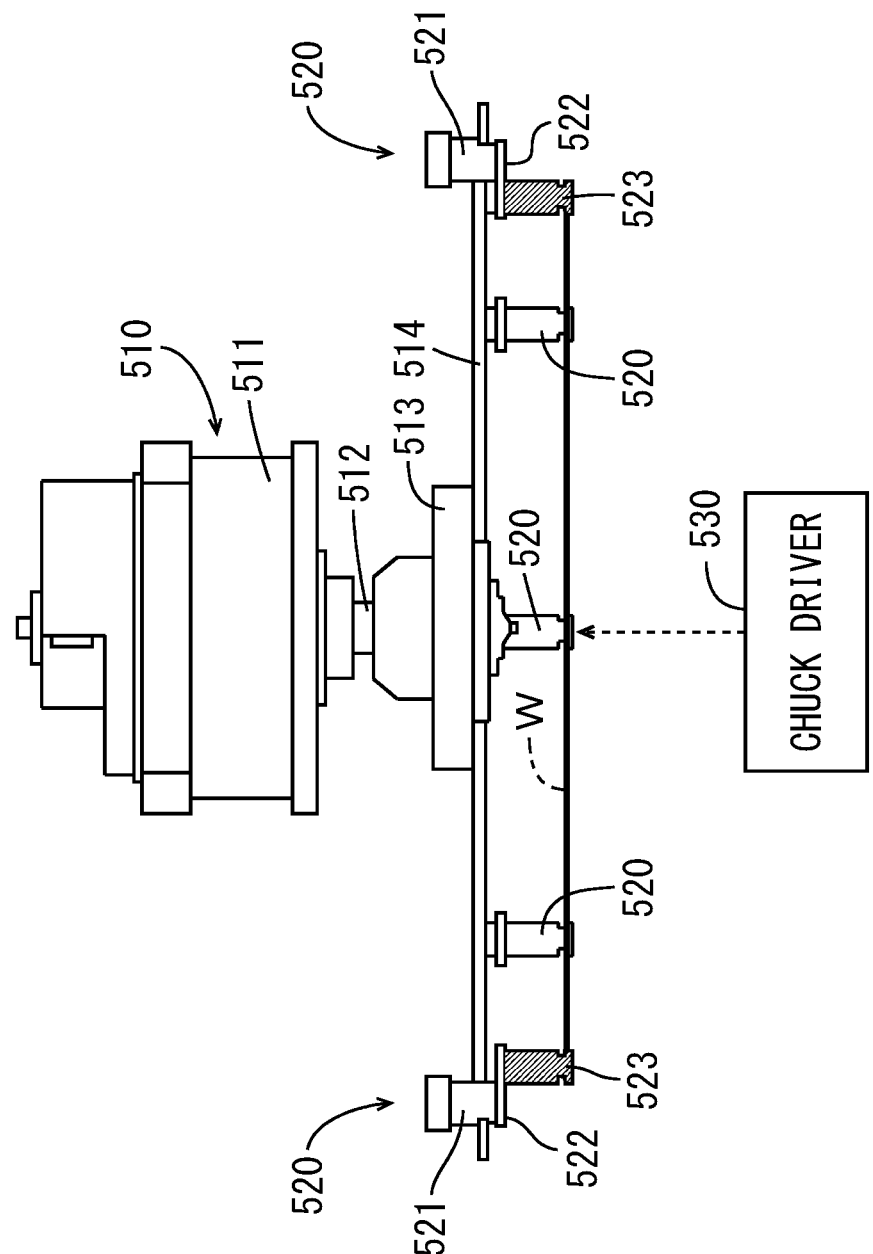
FIG. 12 is a side view showing the configuration of the rotation holder in the eighth embodiment.

In a sixth embodiment, an abnormality in a rotation holder that is included in each processing unit 110 as an operation component of the substrate processor 100 is detected. FIG. 12 is a side view showing the configuration of a rotation holder in the sixth embodiment. As shown in FIG. 12, a rotation holder 500 includes a spin chuck 510, a plurality of chuck pins 520 and a chuck driver 530. The spin chuck 510 is configured to horizontally hold and rotate a substrate W, and includes a spin driver 511, a rotation shaft 512, a plate support member 513 and a spin plate 514.

The spin driver 511 is provided in an upper portion of the processing unit 110 of FIG. 1 and is supported by a support member (not shown). The rotation shaft 512 is provided to extend downwardly from the spin driver 511. The plate support member 513 is attached to the lower end of the rotation shaft 512. The spin plate 514 has a disc shape and is horizontally supported by the plate support member 513. The rotation shaft 512 is rotated by the spin driver 511, so that the spin plate 514 is rotated about a vertical axis.

The plurality of chuck pins 520 are provided in the peripheral portion of the spin plate 514 at equal angular intervals with respect to the rotation shaft 512. In the present example, eight chuck pins 520 are provided in the peripheral portion of the spin plate 514 at intervals of 45 degrees with respect to the rotation shaft 512. Each chuck pin 520 includes a shaft portion 521, a pin supporter 522 and a holder 523. The shaft portion 521 is provided so as to penetrate the spin plate 514 in a vertical direction. The pin supporter 522 is provided so as to extend in a horizontal direction from the lower end of the shaft portion 521. The holder 523 is provided so as to project downwardly from the tip of the pin supporter 522.

Each chuck pin 520 is switched between a close state and an open state by rotating about the vertical axis and the shaft portion 521. In a close state, each holder 523 abuts against the outer peripheral end (bevel portion) of the substrate W. In an open state, each holder 523 is spaced apart from the outer peripheral end of the substrate W.

The chuck driver 530 includes a rotary actuator, a magnet, a linear slide and a cam, for example, and switches between a close state and an open state. FIG. 13 is a functional block diagram showing the configuration of the rotation holder 500. As shown in FIG. 13, the controller 200 provides an instruction for causing the chuck driver 530 to be in a close state (hereinafter referred to as a closing instruction) to the chuck driver 530. Further, the controller 200 provides an instruction for causing the chuck driver 530 to be in an open state (hereinafter referred to as an opening instruction) to the chuck driver 530.

When a closing instruction is provided to the chuck driver 530, air is supplied to the rotary actuator. Thus, the chuck driver 530 enters a close state. In this case, the linear slide moves linearly due to rotation of the magnet. The rectilinear movement of the linear slide is converted by the cam into rotation movement for rotating each chuck pin 520. Thus, each chuck pin 520 enters a close state. On the other hand, when an opening instruction is provided to the chuck driver 530, the supply of air to the rotary actuator is stopped. Thus, the chuck driver 530 enters an open state. In this case, each chuck pin 520 enters an open state.

Further, the rotation holder 500 includes a plurality of Hall sensors 524 and a Hall sensor 531. The plurality of Hall sensors 524 respectively correspond to the plurality of chuck pins 520. Each Hall sensor 524 detects the state of a corresponding chuck pin 520 based on a magnet (not shown) provided in the chuck pin 520 and provides a result of detection to the controller 200. The Hall sensor 531 detects the state of the chuck driver 530 based on a magnet of the chuck driver 530 and provides a result of detection to the controller 200.

(2) Controller

In the following description, the eight chuck pins 520 are referred to as first to eighth chuck pins 520, respectively. The first and second chuck pins 520 are paired, and the third and fourth chuck pins 520 are paired. The fifth and sixth chuck pins 520 are paired, and the seventh and eighth chuck pins 520 are paired. While the operation of the controller 200 in regard to the first and second chuck pins 520 will be described below, the same applies to the operation of the controller 200 in regard to the third to eighth chuck pins 520.

The operation value acquirer 210 of FIG. 3 provides a closing instruction or an opening instruction to the chuck driver 530. Further, the operation value acquirer 210 acquires a transition period of time of the first chuck pin 520 as a first operation value based on a result of detection provided from the Hall sensor 524 corresponding to the first chuck pin 520. Similarly, the operation value acquirer 210 acquires a transition period of time of the second chuck pin 520 as a second operation value based on a result of detection provided from the Hall sensor 524 corresponding to the second chuck pin 520.

The transition period of time of the chuck pin 520 is a period of time from the time when a closing instruction is provided to the chuck driver 530 to the time when the chuck pin 520 enters a closed state, or a period of time from the time when an opening instruction is provided to the chuck driver 530 to the time when the chuck pin 520 enters an open state.

FIG. 14 is a diagram for explaining the transition period of time of the chuck pin 520 when a closing instruction is provided. As shown in FIG. 14, a closing instruction is provided to the chuck driver 530 at a point t1 in time. In this case, the chuck driver 530 switches from an open state to a close state. Thus, each chuck pin 520 switches from an open state to a close state, and the Hall sensor 524 detects that each chuck pin 520 is in a close state at a point t2 in time. The operation value acquirer 210 acquires a transition period Δt1 of time from the point t1 in time at which a closing instruction is provided to the point t2 in time at which a close state is detected in regard to each chuck pin 520.

FIG. 15 is a diagram for explaining a transition period of time of the chuck pin 520 when an opening instruction is provided. As shown in FIG. 15, an opening instruction is provided to the chuck driver 530 at a point t11 in time. In this case, the chuck driver 530 switches from a close state to an open state. Thus, each chuck pin 520 switches from a close state to an open state, and the Hall sensor 524 detects that each chuck pin 520 is in an open state at a point t12 in time. The operation value acquirer 210 acquires a transition period Δt11 of time from the point t11 in time at which an opening instruction is provided to the point t12 in time at which an open state is detected in regard to each chuck pin 520.

Each time a closing instruction or an opening instruction is provided to the chuck driver 530, the abnormality determiner 220 of FIG. 3 plots a datapoint defined based on a set of a transition period of time of the first chuck pin 520 and a transition period of time of the second chuck pin 520 on a correlation graph. Datapoints may be plotted separately for a closing instruction and an opening instruction. In this case, allowable ranges R are defined separately for a closing instruction and an opening instruction.

The abnormality determiner 220 determines whether an abnormality has occurred based on the ratio of datapoints exceeding an allowable range R to plotted datapoints. In a case in which it is determined that an abnormality has occurred, it is presumed that an abnormality has occurred in an operation component relating to the first or second chuck pin 520. An operation component relating to the first or second chuck pin 520 includes a rotary actuator, a magnet, a linear slide, a cam or the like of the chuck driver 530. In a case in which the abnormality determiner 220 determines that an abnormality has occurred, the notifier 230 notifies a user of an occurrence of the abnormality.

An abnormality detection process in the present example is similar to the abnormality detection process of FIG. 5 except that transition period of times of the first and second chucking pins 520 are respectively acquired in the steps S1 and S2. The steps S1 and S2 are performed substantially at the same time in response to a closing instruction or an opening instruction provided to the chuck driver 530. The steps S1 and S2 may be performed in response to only one of a closing instruction and an opening instruction.

(3) Effects

In the substrate processing apparatus 1 according to the present embodiment, the transition periods of time of the first and second chuck pins 520 are respectively acquired by the operation value acquirer 210 as first and second operation values. The abnormality determiner 220 determines whether an abnormality has occurred based on the correlation between the transition period of time of the first chuck pin 520 and the transition period of time of the second chuck pin 520 that are acquired by the operation value acquirer 210. In this case, it is possible to detect an abnormality in the substrate processing apparatus 1 at an early stage based on the correlation between the transition period of time of the first chuck pin 520 and the transition period of time of the second chuck pin 520.

(4) Modified Example

While the transition period of time of the first chuck pin 520 is acquired as a first operation value and the transition period of time of the second chuck pin 520 is acquired as a second operation value in the present embodiment, the embodiment is not limited to this. There may be a time difference between the transition period of time of each chuck pin 520 and the transition period of time of the chuck driver 530.

FIG. 16 is a diagram for explaining the transition periods of time of the chuck pin 520 and the chuck driver 530. As shown in FIG. 16, a closing instruction is provided to the chuck driver 530 at the point t1 in time. In this case, similarly to FIG. 14, a Hall sensor 524 detects that each chuck pin 520 is in a close state at the point t2 in time. On the other hand, the Hall sensor 531 detects that the chuck driver 530 is in a close state at a point t3 in time that is later than the point t2 in time. There may be a similar time difference in regard to an opening instruction.

As such, the transition period Δt1 of any chuck pin 520 may be acquired as a first operation value, and the transition period Δt2 of time of the chuck driver 530 may be acquired as a second operation value. Alternatively, instead of the transition period Δt2 of time, a period of time from the point t2 to the point t3 in time may be acquired as a second operation value. With this configuration, in a case in which it is determined that an abnormality has occurred, it is presumed that an abnormality has occurred in an operation component relating to any of the chuck pins 520 or the chuck driver 530.

(5) Reference Example

As an abnormality detection process in a reference example, it is also possible to monitor the temporal change of the transition period of time of each chuck pin 520 or the chuck driver 530, and determine that an abnormality has occurred in a case in which the transition period of time exceeds a predetermined allowable range. However, in the reference example, even in a case in which no abnormality has actually occurred, it may be determined that an abnormality has occurred when a transition period of time exceeds a predetermined allowable range. Therefore, in the reference example, it is difficult to accurately detect an abnormality.

<8> Seventh Embodiment

(1) Processing Liquid Supplier

In a seventh embodiment, an abnormality in a processing liquid supplier that is included in each processing unit 110 as an operation component of the substrate processor 100 is detected. FIG. 17 is a diagram showing the configuration of a processing liquid supplier. As shown in FIG. 17, the processing liquid supplier 600 includes scan drivers 610, 620 and cleaners 630, 640.

Each of the scan drivers 610, 620 includes a stepping motor and an encoder, for example. The scan driver 610 moves the cleaner 630 between a waiting position outwardly of the substrate W and a processing position below the center of the substrate W based on the pulse control performed by the controller 200. Further, the scan driver 610 detects that the cleaner 630 has arrived at the processing position using the encoder, and provides a positioning completion signal indicating that positioning is completed to the controller 200.

The scan driver 620 moves the cleaner 640 between a waiting position outwardly of the substrate W and a processing position below the center of the substrate W based on the pulse control performed by the controller 200. Further, the scan driver 620 detects that the cleaner 640 has arrived at the processing position using the encoder, and provides a positioning completion signal indicating that positioning is completed to the controller 200.

Each of the cleaners 630, 640 is a nozzle, for example, and supplies the processing liquid to the vicinity of the center of the lower surface of the substrate W at the processing position. Thus, the substrate W is processed. The substrate W may be processed while being held by the rotation holder 500 of FIG. 12, for example. The cleaner 630 may be not a nozzle but a brush (a polishing brush is included) for cleaning the substrate W. Similarly, the cleaner 640 may be not a nozzle but a brush (a polishing brush is included) for cleaning the substrate W.

While the scan drivers 610, 620 and the cleaners 630, 640 are provided in the same processing unit 110 in the present example, the embodiment is not limited to this. As long as a substrate process with use of the cleaner 630 and a substrate process with use of the cleaner 640 are performed at substantially the same frequency, the scan driver 610 and the cleaner 630 may be provided in a processing unit 110 different from a processing unit 110 in which the scan driver 620 and the cleaner 640 are provided.

(2) Controller

The operation value acquirer 210 of FIG. 3 performs the pulse control on the scan driver 610 during the substrate process, thereby moving the cleaner 630 from the waiting position to the processing position. Further, the operation value acquirer 210 acquires the moving period of time of the cleaner 630 as a first operation value based on a positioning completion signal provided from the scan driver 610. The moving period of time of the cleaner 630 is a period of time from the time when the pulse control of the scan driver 610 is started to the time when the positioning completion signal is supplied.

FIG. 18 is a diagram for explaining the moving period of time of the cleaner 630. In FIG. 18, the abscissa indicates the time, and the ordinate indicates a pulse value supplied to the scan driver 610. As shown in FIG. 18, the pulse control of the scan driver 610 is started at a point t21 in time. In this case, the cleaner 630 moves from the waiting position toward the processing position. At a point t22 in time, a positioning complete signal is supplied. Thus, the operation value acquirer 210 ends the pulse control. Further, the operation value acquirer 210 acquires a moving period $\Delta t21$ of time from the point t21 in time at which the pulse control is started to the point t22 in time at which the positioning completion signal is supplied.

Similarly, the operation value acquirer 210 performs the pulse control on the scan driver 620 during the substrate process, thereby moving the cleaner 640 from the waiting position toward the processing position. Further, the operation value acquirer 210 acquires the moving period of time of the cleaner 640 as a second operation value based on the positioning completion signal provided from the scan driver 620. The moving period of time of the cleaner 640 is a period of time from the time when the pulse control of the scan driver 620 is started to the time when the positioning completion signal is supplied.

Each of the cleaners 630, 640 is returned from the processing position to the waiting position after the substrate process ends. While the moving periods of time of the cleaners 630, 640 from the waiting position to the processing position are respectively the first and second operation values, the embodiment is not limited to this. The moving period of time of the cleaners 630, 640 from the processing position to the waiting position may respectively be the first and second operating values.

The abnormality determiner 220 of FIG. 3 plots a datapoint defined by a set of the moving period of time of the cleaner 630 and the moving period of time of the cleaner 640 on a correlation graph each time the pulse control is performed on the scan drivers 610, 620. Further, the abnormality determiner 220 determines whether an abnormality has occurred based on the ratio of datapoints exceeding an allowable range R to the plotted datapoints. In a case in which it is determined that an abnormality has occurred, it is presumed that an abnormality has occurred in an operation component relating to the scan drivers 610, 620. In a case in which the abnormality determiner 220 determines that an abnormality has occurred, the notifier 230 notifies a user of an occurrence of the abnormality.

The abnormality detection process in the present example is similar to the abnormality detection process of FIG. 5 except that the moving period of times of the cleaners 630, 640 are respectively acquired in the steps S1 and S2. Either of the steps S1 and S2 may be performed first. In a case in which the scan driver 610 and the cleaner 630 are provided in the processing unit 110 different from the processing unit 110 in which the scan driver 620 and the cleaner 640 are provided, the steps S1 and S2 may be performed at substantially the same time.

(3) Effects

In the substrate processing apparatus 1 according to the present embodiment, the moving periods of time of the cleaners 630, 640 are respectively acquired by the operation value acquirer 210 as first and second operation values. The abnormality determiner 220 determines whether an abnormality has occurred based on the correlation between the moving period of time of the cleaner 630 and the moving period of time of the cleaner 640 acquired by the operation value acquirer 210. In this case, it is possible to detect an abnormality in the substrate processing apparatus 1 at an early stage based on the correlation between the transition period of time of the cleaner 630 and the transition time of the cleaner 640.

(4) Reference Example

As an abnormality detection process in a reference example, it is also possible to determine that an abnormality has occurred in a case in which the temporal change of the moving period of time of the cleaner 630 or the cleaner 640 is monitored and the moving period of time exceeds a predetermined allowable range. However, in the reference example, even in a case in which no abnormality has actually occurred, it may be determined that an abnormality has occurred when a moving period of time exceeds a predetermined allowable range. Therefore, in the reference example, it is difficult to detect an abnormality accurately.

<9> Eighth Embodiment (1) Rotation Holder

In an eighth embodiment, an abnormality in a rotation holder included in each processing unit 110 is detected as an operation component of the substrate processor 100. FIG. 19 is a side view showing the configuration of the rotation holder in the eighth embodiment. As shown in FIG. 19, the rotation holder 700 includes a spin driver 710, a rotation shaft 720 and a sucker 730.

The spin driver 710 is provided in the bottom portion of the processing unit 110 of FIG. 1. The rotation shaft 720 is provided to extend upwardly from the spin driver 710. The sucker 730 is attached to the upper end of the rotation shaft 720 and holds the substrate W horizontally by sucking the substrate W. The rotation shaft 720 is rotated by the spin driver 710, so that the sucker 730 is rotated about a vertical axis.

The spin driver 710 is provided with a torque sensor 711 and a temperature sensor 712. The torque sensor 711 detects a torque of the spin driver 710 and provides a result of detection to the controller 200. The temperature sensor 712 detects a temperature of the spin driver 710 and provides a result of detection to the controller 200. A torque detected in the present example is expressed as a percentage [%] with respect to a rated torque.

(2) Controller

Figure 20:
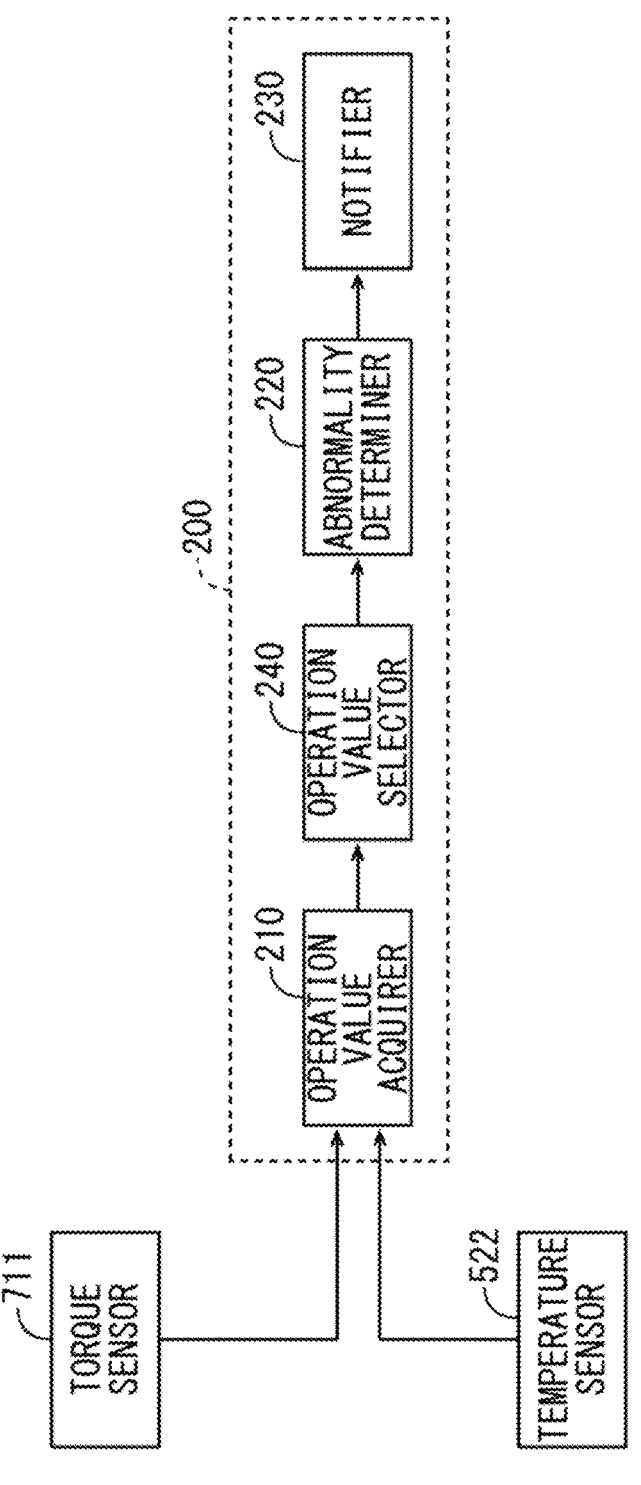
FIG. 20 is the functional block diagram showing the configuration of the controller.

FIG. 20 is a functional block diagram showing the configuration of the controller 200. As shown in FIG. 20, the controller 200 in the present embodiment further includes an operation value selector 240. Differences of the operation of the controller 200 in the present embodiment from that of the controller 200 of FIG. 3 will be mainly described below.

FIG. 21 is a diagram showing the changes of a rotation speed and a torque of the spin driver 710 in a substrate process. In the upper field of FIG. 21, the temporal change of the rotation speed of the spin driver 710 when one substrate W is processed is shown. The temporal change of a rotation speed of the spin driver 710 is defined by the recipe of the substrate process. In the lower field of FIG. 21, the temporal change of a torque of the spin driver 710 when one substrate W is processed is shown so as to correspond to the rotation speed of the spin driver 710.

As shown in the portion A of FIG. 21, when the rotation speed of the spin driver 710 rapidly changes, a torque of the spin driver 710 becomes extremely large. As such, the operation value acquirer 210 acquires a torque when the spin driver 710 is rotating at a predetermined constant rotation speed, as shown in the portion B of FIG. 21, as a first operation value from the torque sensor 711 based on the recipe of the substrate process. Further, the operation value acquirer 210 acquires a temperature when the spin driver

710 is rotating at the above-mentioned predetermined constant rotation speed as a second operation value from the temperature sensor 712.

In a case in which the rotation speed of the spin driver 710 during the substrate process is substantially constant, all of the torques detected by the torque sensor 711 may be acquired as first operation values. Similarly, in a case in which the rotation speed of the spin driver 710 during the substrate process is substantially constant, all of the temperatures detected by the temperature sensor 712 may be acquired as second operation values.

FIG. 22 is a diagram showing the acquired torques and temperatures. In the upper field of FIG. 22, the temporal change of the acquired torques is shown. In the lower field of FIG. 22, the temporal change of the acquired temperatures is shown to correspond to the torques. In FIG. 22, whether the acquired temperatures are equal to or higher than a predetermined reference temperature is shown. In a case in which the temperature is equal to or higher than the reference temperature, it is indicated as "high." In a case in which the temperature is lower than the reference temperature, it is indicated as "low."

As shown in the upper field of FIG. 22, because being acquired when the spin driver 710 is rotating at a constant rotation speed, a torque does not change extremely greatly but changes in a relatively limited range. On the other hand, as a result of various experiments and study, the inventors of the present invention have obtained the following knowledge in regard to a torque and a temperature of the spin driver 710.

As shown in the portion C of FIG. 22, a torque is relatively large at a point in time immediately after the start of the substrate process. Similarly, as shown in the portion D of FIG. 22, a torque is relatively large also at a point in time at which a relatively long period of time has elapsed from the point in time at which a torque is previously acquired. Further, at a point in time immediately before the start of the substrate process or a point in time at which a relatively long period of time has elapsed from the point in time at which a torque is previously acquired, the temperature of the spin driver 710 is relatively low. That is, a torque and a temperature have a correlation. Further, even in a case in which the rotation speed of the spin driver 710 is constant, when the temperature of the spin driver 710 is relatively low, a torque is relatively large.

As such, the operation value selector 240 selects a temperature equal to or higher than a reference temperature out of the temperatures acquired by the operation value acquirer 210. Further, the operation value selector 240 selects a torque corresponding to a selected temperature out of the torques acquired by the operation value acquirer 210. The abnormality determiner 220 determines whether an abnormality has occurred based on the change of a torque selected by the operation value selector 240.

FIG. 23 is a diagram for explaining one example of an abnormality determination method. In FIG. 23, the abscissa indicates the date on which a torque is acquired, and the ordinate indicates an acquired torque. As shown in FIG. 23, in the present example, a box-and-whisker diagram is created based on a torque acquired on each day, and the created box-and-whisker diagrams are arranged in a chronological order. Further, whether the straight line indicating a predetermined torque reference value (3% in the example of FIG. 23) passes through the box of a box-and-whisker diagram is determined. In a case in which the straight line indicating the torque reference value does not pass through the box portion of a box-and-whisker diagram a predetermined number of times (on a predetermined number of days in the present example) or more, it is determined that an abnormality has occurred.

The abnormality determination method is not limited to the above-mentioned example. In a case in which the temporal change of a torque selected by the operation value selector 240 is monitored, and a torque exceeds a predetermined allowable range a predetermined number of times or more, it may be determined that an abnormality has occurred. In a case in which the abnormality determiner 220 determines that an abnormality has occurred, the notifier 230 notifies a user of an occurrence of the abnormality.

(3) Abnormality Detection Process

FIG. 24 is a flowchart showing an abnormality detection process performed by the controller 200 of FIG. 20. The abnormality detection process of FIG. 24 is performed by execution of the abnormality detection program stored in the memory by the CPU of the controller 200. The abnormality detection process is performed in parallel with a substrate process on each day. The abnormality detection process will be explained with reference to the controller 200 of FIG. 20 and the flowchart of FIG. 24.

First, the operation value acquirer 210 acquires a torque of the spin driver 710 when the spin driver 710 is rotating at a predetermined constant rotation speed from the torque sensor 711 (step S11). Further, the operation value acquirer 210 acquires a temperature corresponding to the torque acquired in the step S11 from the temperature sensor 712 (step S12). The steps S11 and S12 are performed at substantially the same time as the rotating substrate W is processed based on the recipe of the substrate process.

Next, the operation value selector 240 selects a temperature equal to or higher than a reference temperature out of the temperatures acquired in the step S12 (step S13). Subsequently, the operation value selector 240 selects a torque corresponding to the temperature selected in the step S13 out of the torques acquired in the step S11 (step S14).

Thereafter, the abnormality determiner 220 determines whether the process of all of the substrates W to be processed has ended (step S15). In a case in which the process of all of the substrates to be processed has not ended, the abnormality determiner 220 returns to the step S11. The steps S11 to S15 are repeated until the process of all of the substrates to be processed ends.

In a case in which the process of all of the substrates to be processed has ended, the abnormality determiner 220 creates a box-and-whisker diagrams using a torque selected in the step S14 (step S16). Next, the abnormality determiner 220 arranges the box-and-whisker diagram created in the step S16 and the box-and-whisker diagrams that have been created by the day before in a chronological order (step S17).

Subsequently, the abnormality determiner 220 determines whether the straight line indicating a torque reference value passes through the box portions of the box-and-whisker diagrams arranged in the step S17 on a predetermined number of days or more (step S18). In a case in which the straight line passes through the box portions of the box-and-whisker diagrams on the predetermined number of days or more, the abnormality determiner 220 does not determine that an abnormality has occurred and ends the abnormality detection process. In a case in which the straight line does not pass through the box portions of the box-and-whisker diagrams on the predetermined number of days or more, the abnormality determiner 220 determines that an abnormality has occurred. In this case, the notifier 230 makes notification of an occurrence of the abnormality (step S19) and ends the abnormality detection process.

(4) Effects

In the substrate processing apparatus 1 according to the present embodiment, a torque of the spin driver 710 is acquired by the operation value acquirer 210 as a first operation value. Further, the temperature of the spin driver 710 is acquired by the operation value acquirer 210 as a second operation value. Out of the temperatures acquired by the operation value acquirer 210, a temperature equal to or higher than the reference temperature is selected by the operation value selector 240. Further, a torque corresponding to the selected temperature out of the torques acquired by the operation value acquirer 210 is selected by the operation value selector 240.

Whether an abnormality has occurred is determined by the abnormality determiner 220 based on the change of the time-series of a torque selected by the operation value selector 240. In this case, because it is determined whether an abnormality has occurred based on the change of a time-series of a torque satisfying a predetermined standard out of the acquired torques, it is possible to easily and accurately detect an abnormality in the substrate processing apparatus 1.

A torque acquired as a first operation value is a torque acquired when the spin driver 710 is rotating at a constant rotation speed. Similarly, the temperature acquired as a second operation value is a temperature acquired when the spin driver 710 is rotating at a constant rotation speed. Therefore, it is possible to detect an abnormality in the substrate processing apparatus 1 more accurately.

(5) Reference Example

As an abnormality detection process in a reference example, it is also possible to create the above-mentioned box-and-whisker diagrams using all of torques of the spin driver 710 acquired by the operation value acquirer 210 regardless of a temperature of the spin driver 710. With this configuration, in a case in which the straight line indicating a torque reference value does not pass through a box-and-whisker diagram on a predetermined number of days or more, it is determined that an abnormality has occurred.

However, in the reference example, because the temperature of the spin driver 710 is low, the straight line indicating the torque reference value may not pass through the box portion of a box-and-whisker diagram. That is, even in a case in which no abnormality has actually occurred, it may be determined that an abnormality has occurred because the straight line indicating the torque reference value does not pass through the box portion of a box-and-whisker diagram on a predetermined number of days or more. Therefore, in the reference example, it is difficult to detect an abnormality accurately.

<10> Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained.

In the above-mentioned embodiment, the substrate W is an example of a substrate, the substrate processing apparatus 1 is an example of a substrate processing apparatus, the operation value acquirer 210 is an example of an operation value acquirer, and the abnormality determiner 220 is an example of an abnormality determiner. The allowable range R is an example of an allowable range, the operation value selector 240 is an example of an operation value selector, and the controller 200 is an example of a processing device.

In the first embodiment, the regulating valve 414 is an example of a first operation component or a first regulating valve, and the regulating valve 424 is an example of a second operation component or a second regulating valve. Alternatively, in the first embodiment, the regulating valve 414 or the regulating valve 424 is an example of a first operation component or a regulating valve, and the manometer 402 is an example of a second operation component or a manometer.

In the second to fifth embodiments, the flowmeter 313 is an example of a first operation component or a first flowmeter, the flowmeter 323 is an example of a first operation component or a second flowmeter, and the concentration meter 364 is an example of a second operation component or a concentration meter. The mixing tank 350 is an example of a storage, the substrate processor 100 is an example of a substrate processor, the mixing pipe 330 is an example of a first flow path portion, the supply pipe 360 is an example of a second flow path portion, and the circulation pipe 370 is an example of a third flow path portion.

In the sixth embodiment, the first chuck pin 520 is an example of a first operation component or a first chuck pin, and the second chuck pin 520 is an example of a second operation component or a second chuck pin. Alternatively, in the sixth embodiment, any one of the chuck pins 520 is an example of a first operation component or a chuck pin, and the chuck driver 530 is an example of a second operation component or a chuck driver.

In the seventh embodiment, the cleaner 630 is an example of a first operation component or a first processor, and the cleaner 640 is an example of a second operation component or a second processor. In the eighth embodiment, the spin driver 710 is an example of a spin driver, the torque sensor 711 is an example of a first operation component or a torque sensor, and the temperature sensor 712 is an example of a second operation component or a temperature sensor.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate processing apparatus that includes a first operation component and a second operation component that are used in a substrate process with use of a processing liquid, comprising:

an operation value acquirer that acquires a first operation value of the first operation component and a second operation value of the second operation component; and an abnormality determiner that determines whether an abnormality has occurred based on a correlation between the first operation value and the second operation value that are acquired by the operation value acquirer, wherein the first operation component includes a first regulating valve that regulates a flow rate of the processing liquid to be supplied to a substrate based on a first pulse value, the second operation component includes a second regulating valve that regulates the flow rate of the processing liquid to be supplied to the substrate based on a second pulse value, the first operation value is the first pulse value supplied to the first regulating valve, and the second operation value is the second pulse value supplied to the second regulating valve.

2. The substrate processing apparatus according to claim 1, wherein the abnormality determiner determines whether an abnormality has occurred based on a ratio of datapoints exceeding an allowable range defined based on a correlation between the first operation value and the second operation value to datapoints defined by sets of the first operation value and the second operation value that are acquired by the operation value acquirer.

3. The substrate processing apparatus according to claim 2, wherein the allowable range is defined so as to include a predetermined ratio of datapoints out of datapoints defined by sets of the first operation value and the second operation value that are acquired in advance by the operation value acquirer before the substrate process.

4. An abnormality detection method of detecting an abnormality in a substrate processing apparatus that includes a first operation component and a second operation component that are used in a substrate process with use of a processing liquid, including:

acquiring a first operation value of the first operation component and a second operation value of the second operation component that are correlated with each other; and determining whether an abnormality has occurred based on the acquired first operation value and the acquired second operation value, wherein the first operation component includes a first regulating valve that regulates a flow rate of the processing liquid to be supplied to a substrate based on a first pulse value, the second operation component includes a second regulating valve that regulates the flow rate of the processing liquid to be supplied to the substrate based on a second pulse value, the first operation value is the first pulse value supplied to the first regulating valve, and the second operation value is the second pulse value supplied to the second regulating valve.

5. A non-transitory computer readable medium storing an abnormality detection program that is executed by a processing device and detects an abnormality in a substrate processing apparatus including a first operation component and a second operation component that are used in a substrate process with use of a processing liquid, the abnormality detection program causing the processing device to perform the processes of:

acquiring a first operation value of the first operation component and a second operation value of the second operation component that are correlated with each other; and determining whether an abnormality has occurred based on the acquired first operation value and the acquired second operation value, wherein the first operation component includes a first regulating valve that regulates a flow rate of the processing liquid to be supplied to a substrate based on a first pulse value, the second operation component includes a second regulating valve that regulates the flow rate of the processing liquid to be supplied to the substrate based on a second pulse value, the first operation value is the first pulse value supplied to the first regulating valve, and the second operation value is the second pulse value supplied to the second regulating valve.

* * * * *